(12) United States Patent
Chang et al.

(10) Patent No.: US 12,046,554 B2
(45) Date of Patent: Jul. 23, 2024

(54) DEVICE LAYOUT DESIGN FOR IMPROVING DEVICE PERFORMANCE

(71) Applicant: Taiwan Semiconductor Manufacturing Company, Ltd., Hsinchu (TW)

(72) Inventors: Shih-Pang Chang, Hsinchu (TW); Haw-Yun Wu, Hsinchu County (TW); Yao-Chung Chang, Zhubei (TW); Chun-Lin Tsai, Hsin-Chu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 109 days.

(21) Appl. No.: 17/672,325

(22) Filed: Feb. 15, 2022

(65) Prior Publication Data
US 2023/0120292 A1 Apr. 20, 2023

Related U.S. Application Data

(60) Provisional application No. 63/257,177, filed on Oct. 19, 2021.

(51) Int. Cl.
*H01L 23/528* (2006.01)
*H01L 23/522* (2006.01)
(Continued)

(52) U.S. Cl.
CPC ........ *H01L 23/528* (2013.01); *H01L 23/5226* (2013.01); *H01L 29/401* (2013.01); *H01L 29/41758* (2013.01); *H01L 29/4238* (2013.01)

(58) Field of Classification Search
CPC . H01L 23/528; H01L 23/5226; H01L 29/401; H01L 29/41758; H01L 29/4238;
(Continued)

(56) References Cited

U.S. PATENT DOCUMENTS 6,404,030 B1 * 6/2002 Ma .................... H01L 29/41758
257/E29.12
10,483,352 B1 * 11/2019 Mokhti .................. H03F 3/195
(Continued)

FOREIGN PATENT DOCUMENTS

JP 2018074025 A 5/2018

*Primary Examiner* — Shahed Ahmed
*Assistant Examiner* — Khatib A Rahman
(74) *Attorney, Agent, or Firm* — Eschweiler & Potashnik, LLC

(57) ABSTRACT

The present disclosure relates an integrated chip. The integrated chip includes an isolation region disposed within a substrate and surrounding an active area. A gate structure is disposed over the substrate and has a base region and a gate extension finger protruding outward from a sidewall of the base region along a first direction to past opposing sides of the active area. A source contact is disposed within the active area and a drain contact is disposed within the active area and is separated from the source contact by the gate extension finger. A first plurality of conductive contacts are arranged on the gate structure and separated along the first direction. The first plurality of conductive contacts are separated by distances overlying the gate extension finger.

20 Claims, 23 Drawing Sheets

(51) Int. Cl.
*H01L 29/40* (2006.01)
*H01L 29/417* (2006.01)
*H01L 29/423* (2006.01)

(58) Field of Classification Search
CPC ............. H01L 29/2003; H01L 29/0696; H01L 29/7786; H01L 29/20; H01L 23/5283; H01L 23/482; H01L 29/7783; H01L 27/0605; H01L 29/42372; H01L 29/66462
See application file for complete search history.

(56) References Cited

U.S. PATENT DOCUMENTS

| | | | |
|---|---|---|---|
| 2017/0271329 A1* | 9/2017 | Farrell | H01L 27/088 |
| 2018/0138134 A1* | 5/2018 | Chikamatsu | H01L 21/4842 |
| 2021/0050439 A1* | 2/2021 | Prechtl | H01L 29/1066 |
| 2022/0393010 A1* | 12/2022 | Valk | H01L 29/4238 |

* cited by examiner

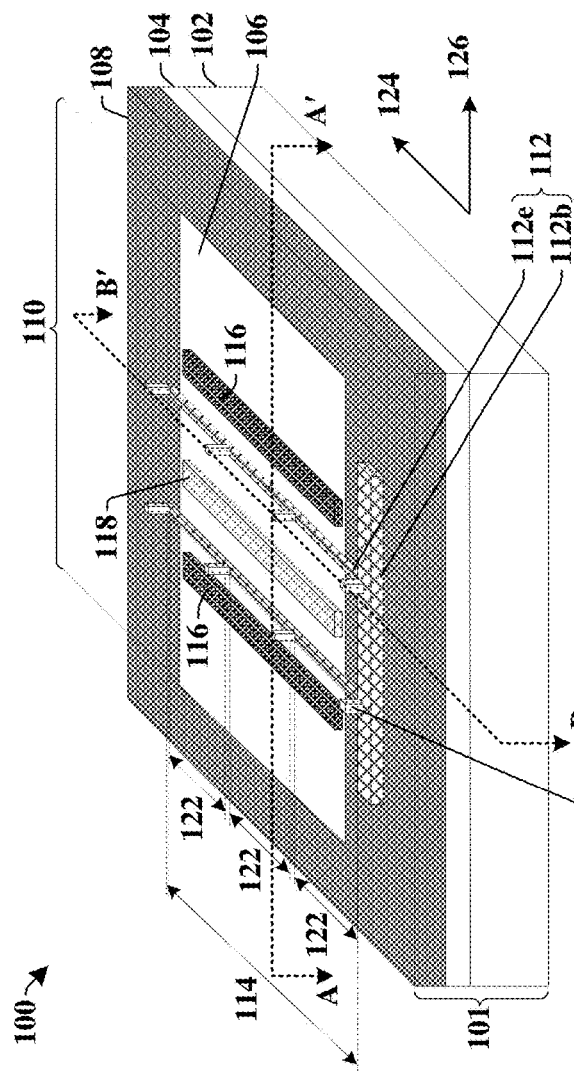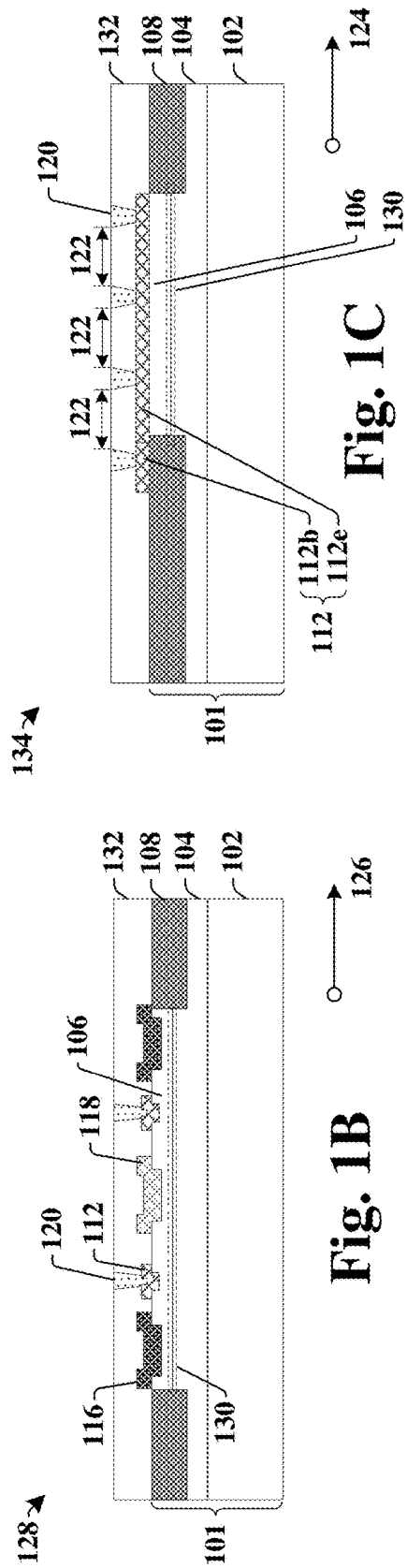

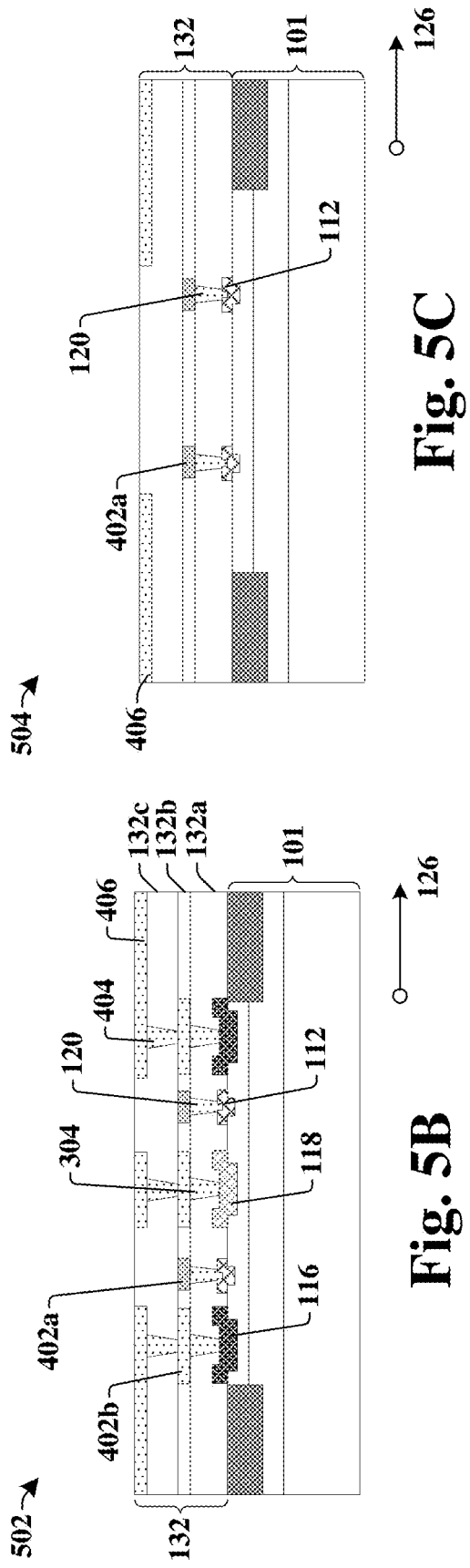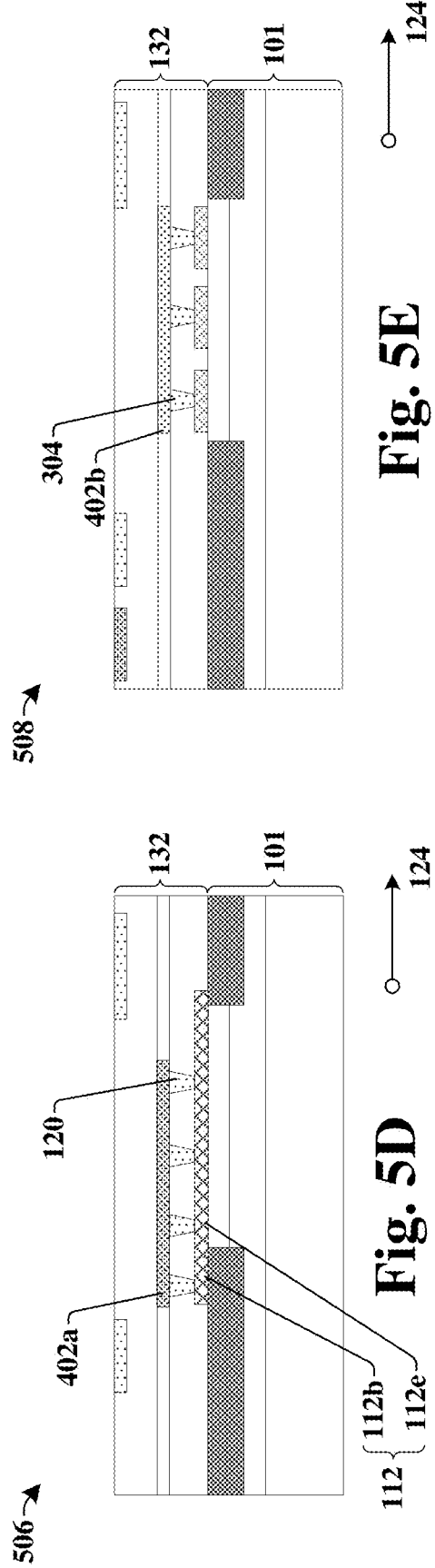

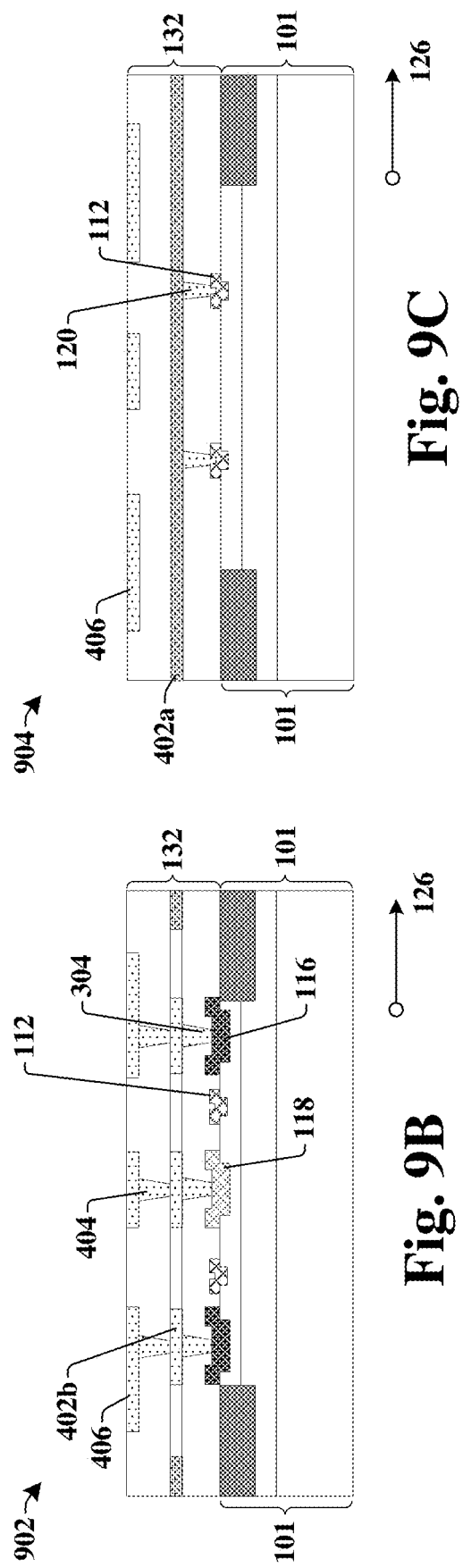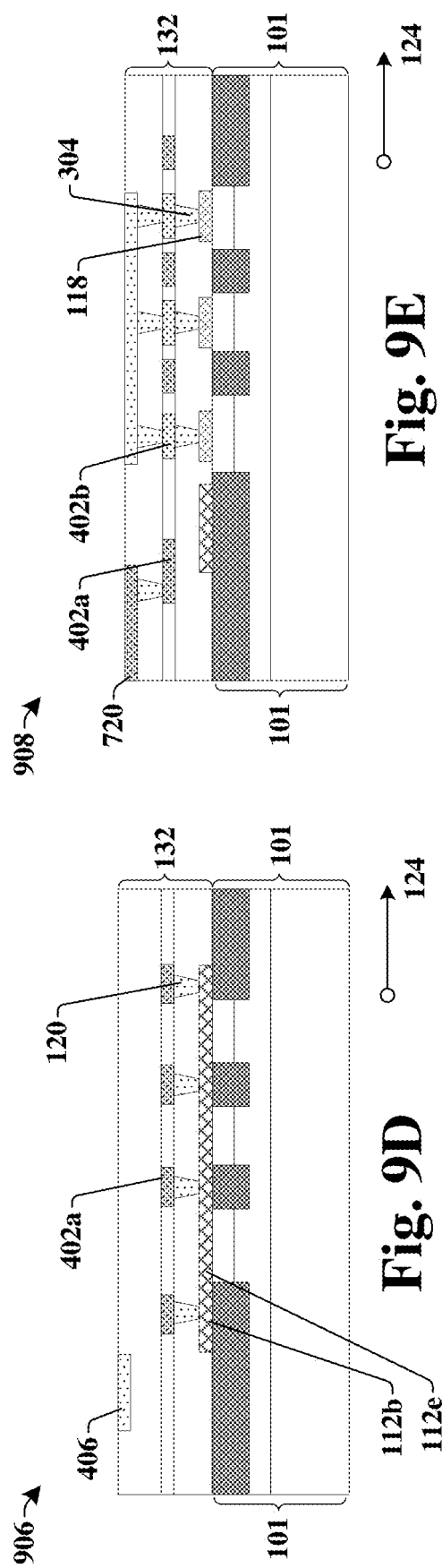

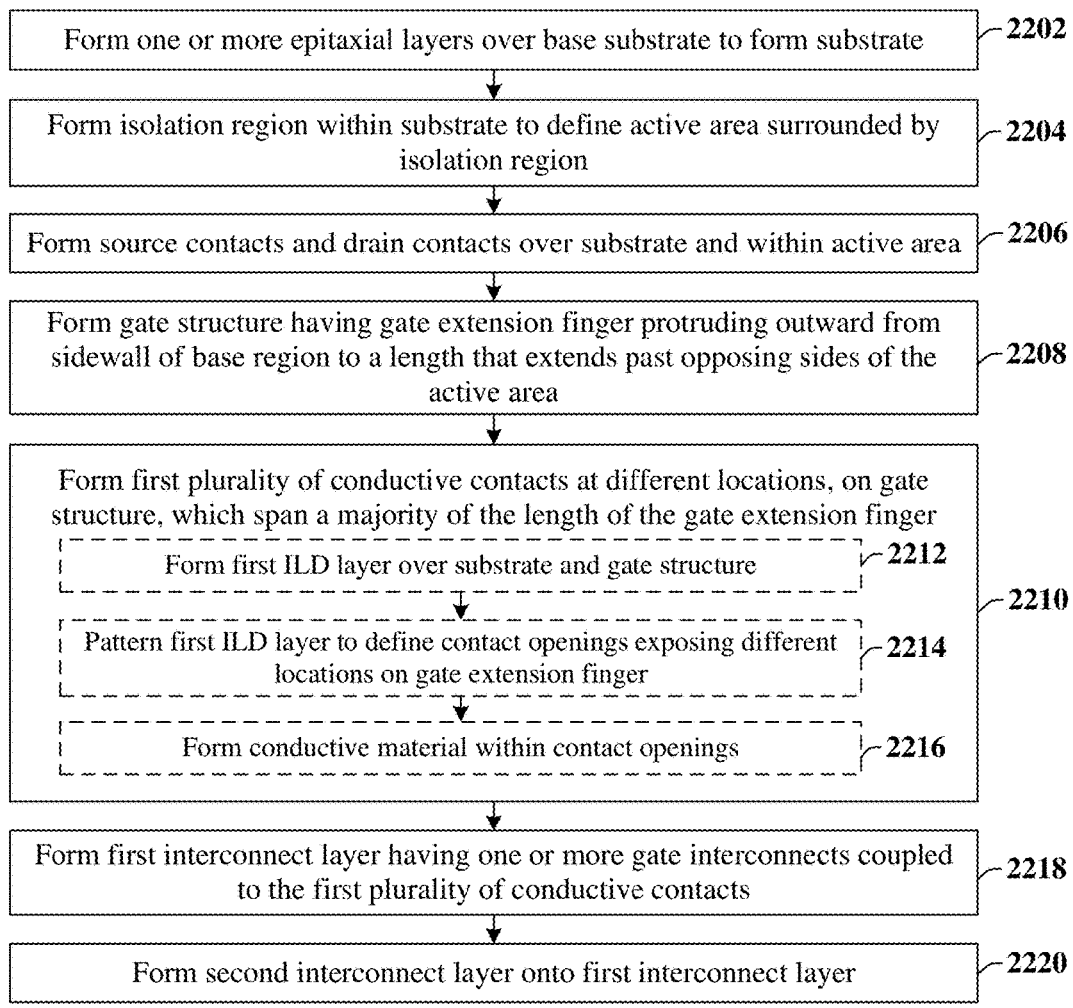

DEVICE LAYOUT DESIGN FOR IMPROVING DEVICE PERFORMANCE

REFERENCE TO RELATED APPLICATION

This application claims the benefit of U.S. Provisional Application No. 63/257,177, filed on Oct. 19, 2021, the contents of which are hereby incorporated by reference in their entirety.

BACKGROUND

Integrated chips (ICs) may use different types of transistor devices depending on an application of an IC. In recent years, the increasing market for cellular and RF (radio frequency) devices has resulted in a significant increase in the use of high power transistor devices. For example, high power transistor devices are often used in power amplifiers for RF transmission/receiving chains due to their ability to handle high breakdown voltages (e.g., greater than about 50V) and high frequencies. High power transistor devices are also used in power management integrated circuits, automotive electronics, sensor interfaces, flat panel display driver applications, etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-1C illustrate some embodiments of an integrated chip having a high power transistor device with a low gate resistance.

FIGS. 5A-5E illustrate some additional embodiments of an integrated chip having a disclosed high power transistor device.

FIGS. 9A-9E illustrate some additional embodiments of an integrated chip having a high power transistor device with a low gate resistance.

FIG. 22 illustrates a flow diagram of some embodiments of a method of forming an integrated chip having a high power transistor device with a low gate resistance.

DETAILED DESCRIPTION

Figure 2A:
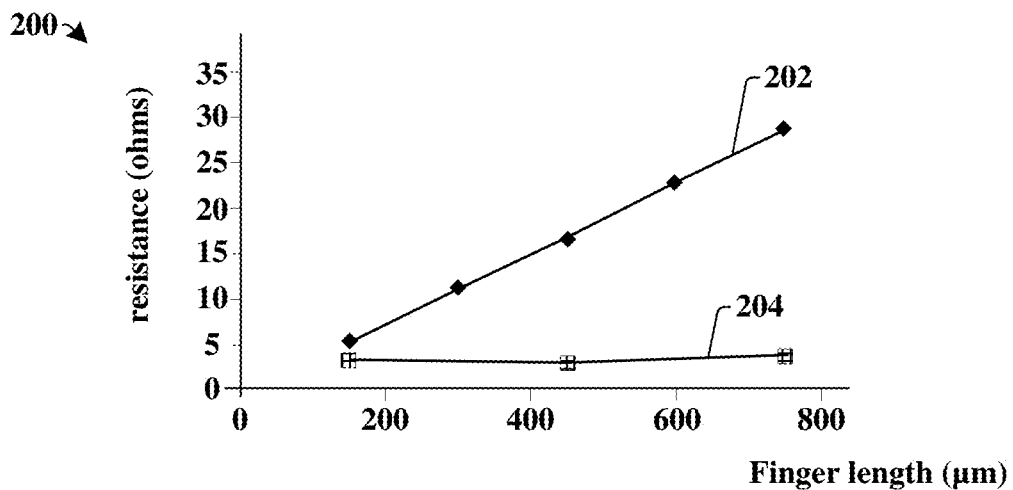
FIGS. 2A-2C illustrate some embodiments of graphs showing device parameters of a disclosed high power transistor device as a function of gate extension finger length.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

High power transistor devices (e.g., high voltage transistor devices) are used in many modern day electronic devices. One popular type of high power transistor device is a high electron mobility transistor (HEMT) device. HEMT devices comprise a plurality of semiconductor layers stacked over a base substrate. The plurality of semiconductor layers include an active layer and a barrier layer that contacts an upper surface of the active layer to form a heterojunction at their interface. A two-dimensional electron gas (2DEG) is inherently present along the interface between the active layer and the barrier layer, thereby allowing electrons to move freely along the interface.

A HEMT device may comprise an active area surrounded by an isolation region that confines the 2DEG to within the active area. A source contact and a drain contact are disposed over the active area. A gate structure is disposed within the active area between the source contact and the drain contact.

In some embodiments, the gate structure may comprise a doped semiconductor (e.g., p-doped gallium nitride (GaN)), which is able to interrupt the underlying 2DEG and prevent electrons from moving freely under the gate structure. The gate structure may have a base region and one or more rectangular shaped gate extension fingers that protrude outward from a sidewall of the base region to traverse an entire width of the active area and block the movement of electrons between the source contact and the drain contact. The gate structure is contacted by overlying conductive contacts. The conductive contacts are typically confined over the base region, since the base region may have a greater width than the gate extension fingers and therefore be easier to contact.

Over time, the demands on high power transistor devices have increased. For example, as wireless transmission data speeds become higher, base stations use higher power devices to meet the data speed demands. One way in which HEMT devices can achieve a higher output power (e.g., greater than approximately 10 watts (W), greater than approximately 180 W, or other similar values) is to increase a number of gate extension fingers protruding outward from a base region of a gate structure. However, increasing the number of gate extension fingers may cause a size of a transistor device to become too wide to fit in a standard package. Alternatively, a higher output power may be achieved by increasing lengths of the gate extension fingers. However, it has been appreciated that increasing the lengths of the gate extension fingers will increase a gate resistance of the gate extension fingers and degrade RF performance of the transistor device (e.g., decrease gain and/or power added efficiency (PAE)).

The present disclosure, in some embodiments, relates to an integrated chip comprising a transistor device that is configured to provide a high output power while maintaining a relatively low gate resistance (e.g., a resistance over a gate extension finger of less than approximately 10 Ohms, less than approximately 5 Ohms, or other similar values). In some embodiments, the transistor device includes a gate structure disposed over a substrate. The gate structure comprises a base region and a gate extension finger protruding outward from a sidewall of the base region along a first direction. The gate extension finger protrudes to a length that extends past opposing sides of an active area within the substrate. A source contact and a drain contact are disposed within the active area and are separated by the gate extension finger along a second direction that is perpendicular to the first direction. A first plurality of conductive contacts are arranged on the gate extension finger and are separated along the first direction so as to span a majority of the length of the gate extension finger. Separating the first plurality of conductive contacts over a majority of the length of the gate extension finger provides an alternative path for current to reach different parts of the gate extension finger, and thereby reduces a resistance of the gate extension finger and improves performance of the transistor device (e.g., a power added efficiency, a gain, etc.).

FIGS. 1A-1C illustrate some embodiments of an integrated chip having a high power transistor device with a relatively low gate resistance. FIG. 1A illustrates a three-dimensional view 100 of the integrated chip, FIG. 1B illustrates a cross-sectional view 128 of the integrated chip taken along cross-sectional line A-A' of FIG. 1A, and FIG. 1C illustrates a cross-sectional view 134 of the integrated chip taken along cross-sectional line B-B' of FIG. 1A.

The integrated chip comprises an isolation region 108 disposed within a substrate 101. The isolation region 108 extends along a closed and unbroken path that surrounds an active area 110 within the substrate 101. In some embodiments, the high power transistor device may comprise a high electron mobility transistor (HEMT) device (e.g., a depletion mode HEMT (a D-HEMT), an enhancement mode HEMT (an E-HEMT), a pseduomorphic HEMT (a p-HEMT), or other similar devices). In some such embodiments, the substrate 101 may comprise an active layer 104 (i.e., a channel layer) disposed over a base substrate 102 and a barrier layer 106 disposed over the active layer 104. A two-dimensional electron gas (2DEG) 130 may be present along an interface between the active layer 104 and the barrier layer 106. In other embodiments, the high power transistor device may comprise a silicon CMOS device, a silicon-germanium heterojunction bipolar transistor (SiGe HBT), or other similar devices.

A gate structure 112 is disposed over the substrate 101. The gate structure 112 comprises a base region 112b and one or more gate extension fingers 112e protruding laterally outward from a sidewall of the base region 112b along a first direction 124. In some embodiments, the base region 112b may be disposed directly over the isolation region 108, while the one or more gate extension fingers 112e extend in the first direction 124 to a length 114 that extends past opposing edges of the active area 110. One or more source contacts 116 and one or more drain contacts 118 are disposed over the active area 110. The one or more gate extension fingers 112e extend between the one or more source contacts 116 and the one or more drain contacts 118, so as to separate the one or more source contacts 116 and the one or more drain contacts 118 along a second direction 126 that is perpendicular to the first direction 124. For example, in some embodiments, a first gate extension finger extends between a first source contact and a drain contact and a second gate extension finger extends between a second source contact and the drain contact.

A first plurality of conductive contacts 120 are arranged over the gate structure 112 and are surrounded by a dielectric structure 132. The first plurality of conductive contacts 120 are separated from one another by non-zero distances 122 over the length 114 of the one or more gate extension fingers 112e. In some embodiments, the first plurality of conductive contacts 120 may be spaced apart in the first direction 124 so as to span a majority of the length 114 of the one or more gate extension fingers 112e (e.g., over 50% of the length 114, over 75% of the length 114, over 90% of the length 114, or other similar values). In some embodiments, the non-zero distances 122 between adjacent ones of the first plurality of conductive contacts 120 are substantially equal so that the first plurality of conductive contacts 120 are arranged at a substantially constant pitch.

By spacing the first plurality of conductive contacts 120 apart from one another by the non-zero distances 122, a distance between one of the first plurality of conductive contacts 120 and an area of the one or more gate extension fingers 112e remains relatively small. Since a resistance of a conductor is proportional to a length of the conductor (e.g., $R=\rho L/A$, where R is a resistance, $\rho$ is a resistivity, L is a length, and A is a cross-sectional area), the relatively small distance between the first plurality of conductive contacts 120 and an area of the one or more gate extension fingers 112e provides the one or more gate extension fingers 112e with a relatively low resistance. By having a resistance of the one or more gate extension fingers 112e be relatively low, a performance (e.g., a power added efficiency, a gain, or the like) of the transistor device can be improved.

FIG. 2A illustrates a graph 200 showing some exemplary embodiments of a resistance of a gate extension finger (shown on y-axis) as a function of a length of the gate extension finger (shown on x-axis).

Graph 200 illustrates a resistance 202 of a gate extension finger within a gate structure that is contacted by overlying conductive contacts that are completely confined over a base region of the gate structure. As a length (e.g., corresponding to length 114 of FIG. 1A) of the gate extension finger increases from approximately 150 μm to approximately 750 μm, the resistance 202 of the gate extension finger increases by over 500%. For example, the resistance 202 increases from approximately 5.4 Ohms (Ω) at a length of 150 μm to approximately 28.7Ω at a length of 750 μm. Therefore, contacting the gate structure with conductive contacts that are completely confined over the base region causes an increase in the length of the gate extension finger to have a significant effect on the resistance 202.

Graph 200 further illustrates a resistance 204 of a gate extension finger (e.g., measured over a length 114 of the gate extension finger, as shown in FIG. 1A) within a disclosed transistor device having a gate structure that is contacted by overlying conductive contacts that span a majority of a length of a gate extension finger. As a length of the gate extension finger increases from approximately 150 μm to approximately 750 μm, the resistance 204 of the gate extension finger increases by less than or equal to approximately 15%. Therefore, contacting the gate structure with conductive contacts that span a majority of the length of the gate extension finger mitigates an increase in resistance as a length of a gate extension finger increases.

Figure 2B:
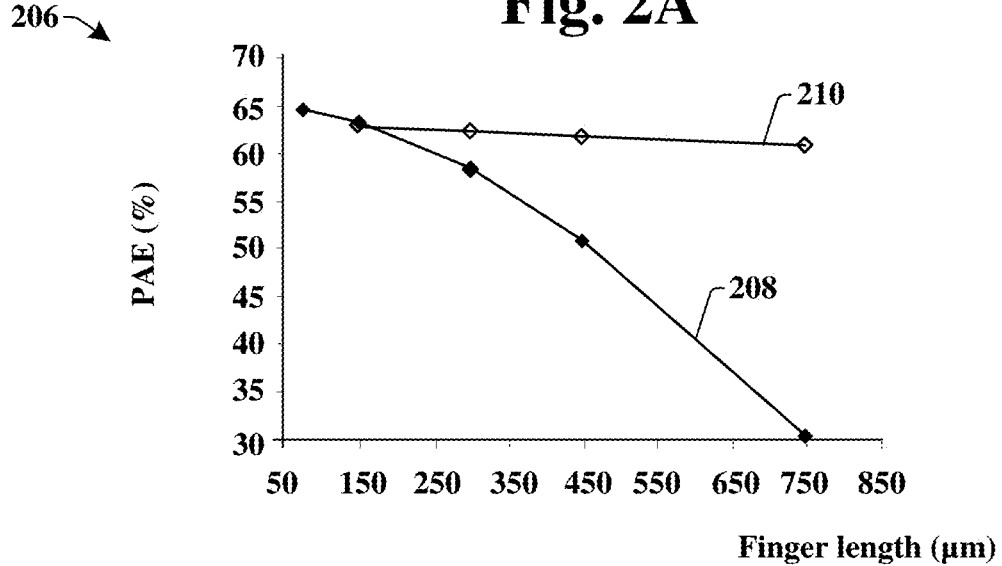

It has been appreciated that mitigating an increase in resistance of a gate extension finger causes improvements in other performance parameters of a transistor device. For example, FIG. 2B illustrates a graph 206 showing some embodiments of a power added efficiency (PAE) (shown on y-axis) as a function of a length of a gate extension finger (shown on x-axis).

Graph 206 illustrates a PAE 208 of a transistor device having a gate structure that is contacted by overlying conductive contacts that are completely confined over a base region of the gate structure. The PAE 208 decreases by over 50% as a length of the gate extension finger increases from approximately 50 μm to approximately 750 μm. For example, the PAE 208 decreases from approximately 65% at a length of 50 μm to approximately 30% at a length of 750 μm. Therefore, increasing the length of the gate extension finger has a significant effect on the PAE 208.

Graph 206 further illustrates a PAE 210 of a disclosed transistor device having a gate structure that is contacted by overlying conductive contacts that span a majority of a length of a gate extension finger. The PAE 210 decreases by approximately 2% as a length of the gate extension finger increases from approximately 150 μm to approximately 750 μm. For example, the PAE 210 decreases from approximately 63% at a length of 150 μm to approximately 61% at a length of 750 μm. Therefore, increasing the length of the gate extension finger has a minimal effect on the PAE 210 of the disclosed transistor device.

Figure 2C:
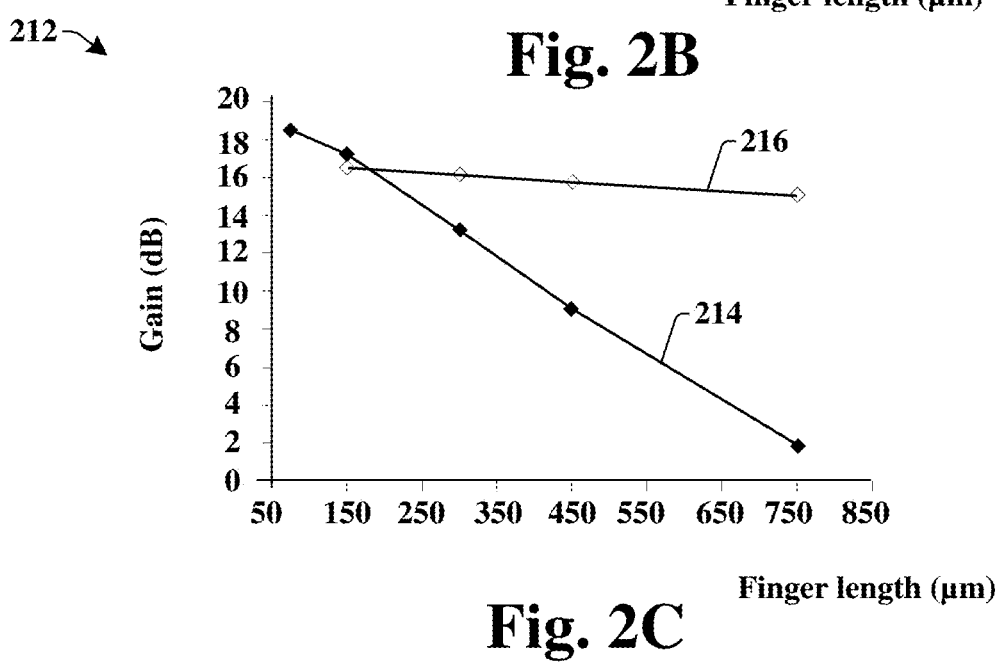

FIG. 2C illustrates a graph 212 showing some embodiments of a gain (shown on y-axis) as a function of a length of a gate extension finger (shown on z-axis).

Graph 212 illustrates a gain 214 of a transistor device having a gate structure that is contacted by overlying conductive contacts that are completely confined over a base region of the gate structure. The gain 214 decreases by nearly 90% as a length of the gate extension finger increases from approximately 50 μm to approximately 750 μm. For example, the gain 214 decreases from over 18 dB at a length of 50 μm to approximately 2 dB at a length of 750 μm. Therefore, increasing the length of the gate extension finger has a significant effect on the gain 214.

Graph 212 further illustrates a gain 216 of a disclosed transistor device having a gate structure that is contacted by overlying conductive contacts that span a majority of a length of a gate extension finger. The gain 216 decreases by less than 10% as a length of the gate extension finger increases from approximately 150 μm to approximately 750 μm. For example, the gain 216 decreases from approximately 16.5 dB at a gate length of 150 μm to approximately 15.1 dB at a gate length of 750 μm. Therefore, increasing the length of the gate extension finger has a minimal effect on the gain 216 of the disclosed transistor device.

Figure 3:
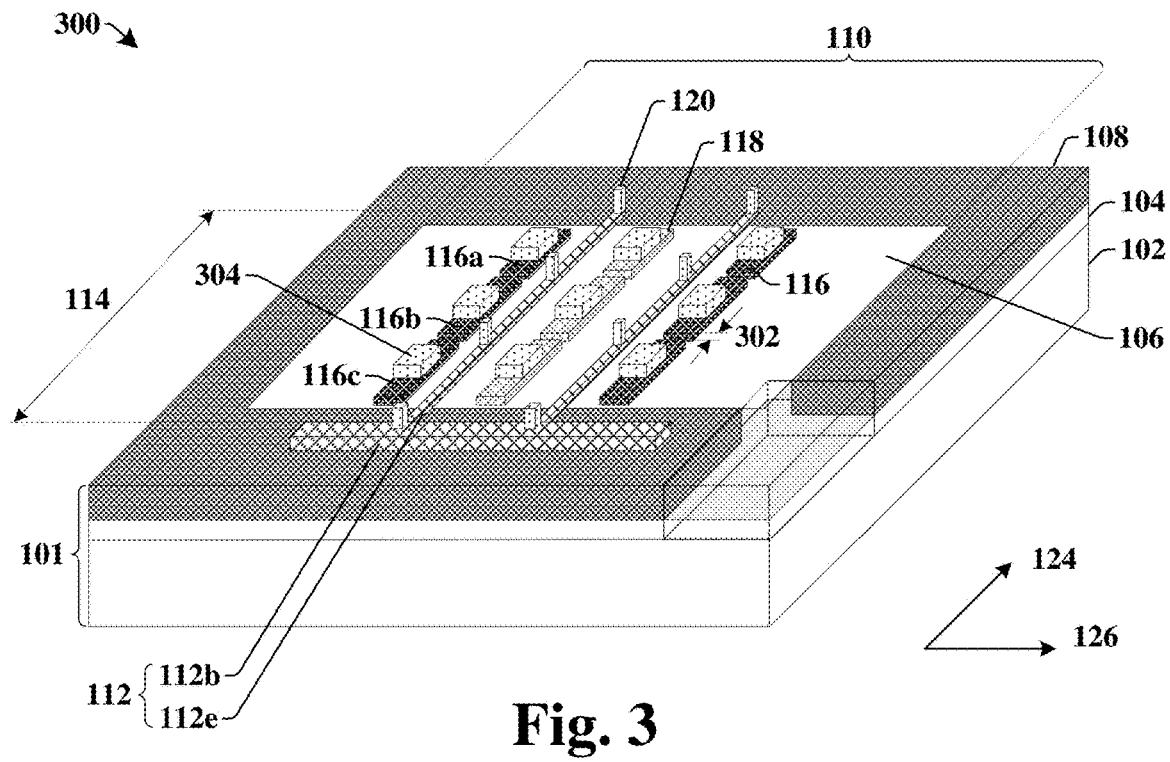
FIG. 3 illustrates a three-dimensional view of some additional embodiments of an integrated chip having a disclosed high power transistor device.

FIG. 3 illustrates a three-dimensional view of some additional embodiments of an integrated chip 300 having a high power transistor device with a low gate resistance.

The integrated chip 300 comprises an isolation region 108 disposed within a substrate 101 and extending along a closed and unbroken path that surrounds an active area 110. In some embodiments, the substrate 101 may comprise an active layer 104 disposed over a base substrate 102 and a barrier layer 106 disposed over the active layer 104. A 2DEG (not shown) is present along an interface between the active layer 104 and the barrier layer 106. In some embodiments, the base substrate 102 may comprise a first semiconductor material (e.g., silicon, silicon carbide, sapphire, or the like), the active layer 104 may comprise a second semiconductor material (e.g., a first group III-V semiconductor material, gallium nitride (GaN), gallium arsenide (GaAs), indium gallium arsenide (InGaAS), or the like), and the barrier layer 106 may comprise a third semiconductor material (e.g., a second group III-V semiconductor material, aluminum gallium nitride (AlGaN), aluminum nitride (AlN), indium aluminum gallium nitride (InAlGaN), indium aluminum arsenide (InAlAs), indium aluminum gallium arsenide (InAlGaAs), indium aluminum gallium phosphate (InAlGaP), silicon germanium (SiGe), or the like). In some embodiments, the isolation region 108 may comprise one or more semiconductor materials that have crystalline damage that disrupts a lateral extent of the 2DEG.

A gate structure 112 is disposed over the substrate 101. The gate structure 112 comprises a base region 112b and one or more gate extension fingers 112e protruding laterally outward from a sidewall of the base region 112b along a first direction 124. The one or more gate extension fingers 112e are over the active area 110 and separate one or more source contacts 116 and one or more drain contacts 118 along a second direction 126 that is perpendicular to the first direction 124. In some embodiments, the one or more gate extension fingers 112e extend outward from the base region 112b to a length 114. In some embodiments, the gate structure 112 may comprise a lower gate portion and a gate electrode disposed over the lower gate portion. In some embodiments, the lower gate portion may comprise a dielectric material (e.g., an oxide, a nitride, or the like). In other embodiments, the lower gate portion may comprise a semiconductor material (e.g., p-doped gallium nitride). In some embodiments, the gate electrode may comprise a metal (e.g., aluminum, titanium, copper, tungsten, tantalum, or the like) or doped polysilicon.

In some embodiments, the one or more source contacts 116 comprise a plurality of discrete source contact segments 116a-116c that are aligned along the first direction 124 and that are separated from one another along the first direction 124. In some additional embodiments, the one or more drain contacts 118 may also comprise a plurality of discrete drain contact segments that are aligned along the first direction 124 and that are separated from one another along the first direction 124. In such embodiments, the one or more gate extension fingers 112e may continuously extend past outer sidewalls of the plurality of discrete source contact segments and/or drain contact segments along the first direction 124. In some additional embodiments, the active area 110 may also continuously extend past the outer sidewalls of the plurality of discrete source contact segments and/or drain contact segments. In some embodiments, adjacent ones of the plurality of discrete source contact segments and/or drain contact segments are separated from one another by a non-zero distance 302. In some embodiments, the non-zero distance 302 may be in a range of between approximately 50 μm and approximately 75 μm, between approximately 30 μm and approximately 50 μm, or other similar values.

A first plurality of conductive contacts 120 are disposed on the gate structure 112 and a second plurality of conductive contacts 304 are disposed on the one or more source contacts 116 and the one or more drain contacts 118. The first plurality of conductive contacts 120 are spaced apart from one another over the one or more gate extension fingers 112e so that the first plurality of conductive contacts 120 span a majority of the length 114 of the one or more gate extension fingers 112e. In some embodiments, one of the second plurality of conductive contacts 304 is arranged on respective ones of the plurality of discrete source contact segments and drain contact segments.

In some embodiments, the non-zero distance 302 between adjacent ones of the plurality of discrete source contact segments and drain contact segments may be aligned with the first plurality of conductive contacts 120 along the second direction 126 (e.g., so that the first plurality of conductive contacts 120 are between the sidewalls of the discrete source/drain contact segments along the first direction 124), thereby increasing a distance between the plurality of discrete source/drain contact segments and the first plurality of conductive contacts 120. Increasing a distance between the plurality of discrete source/drain contact segments and the first plurality of conductive contacts 120 mitigates increases in capacitance (e.g., a capacitance between the gate structure 112 and one or more source contacts 116 and/or the one or more drain contacts 118) that may occur due to placement of the first plurality of conductive contacts 120 on the one or more gate extension fingers 112e. By mitigating increases in capacitance between the gate structure 112 and one or more source contacts 116 and/or the one or more drain contacts 118, the disclosed transistor device can operate over a wide range of operating frequencies with good performance (e.g., over 1 gigahertz (GHz), between approximately 1 GHz and approximately 8 GHz, between approximately 24 GHz and approximately 40 GHz, more than approximately 67 GHz, or other similar values).

In some embodiments, the length 114 of the one or more gate extension fingers 112e may be greater than or equal to approximately 500 microns (μm). In other embodiments, the length 114 may be greater than or equal to approximately 750 μm. By having the length 114 of the one or more gate extension fingers 112e be greater than or equal to approximately 500 μm, the disclosed transistor device is able to achieve a relatively high power (e.g., greater than approximately 10 watts (W), greater than approximately 180 W, or other similar values). Furthermore, while having the length 114 of the gate extension fingers be greater than approximately 500 μm would typically cause the gate structure 112 to have a relatively high gate resistance that is detrimental to device operation, due to the plurality of conductive contacts being spread over the length 114 of the one or more gate extension fingers 112e, the gate resistance remains relatively low. The relatively low gate resistance provides the disclosed transistor device with a good power added efficiency and/or gain. Having the disclosed transistor device operate with a good performance over a large range of power and/or frequency allows for the disclosed transistor device to be used in a wide range of applications (e.g., base stations, radar, wireless communication applications, power amplifiers, low noise amplifiers, etc.).

Figure 4A:
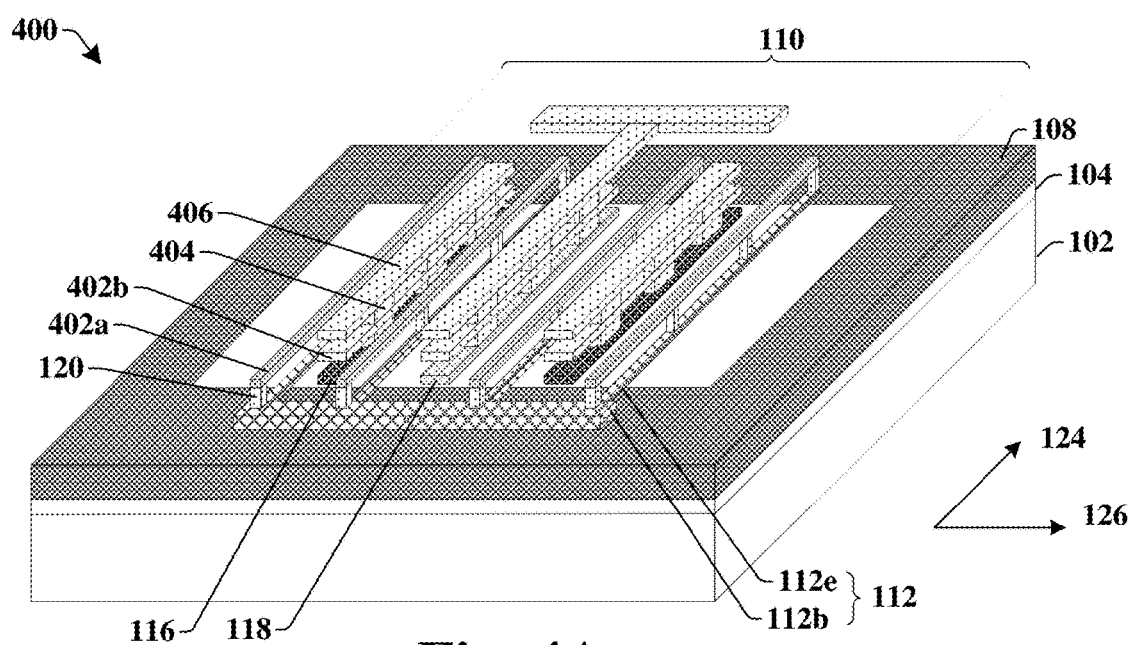
FIG. 4A illustrates a three-dimensional view of some additional embodiments of an integrated chip having a disclosed high power transistor device.

FIG. 4A illustrates a three-dimensional view of some additional embodiments of an integrated chip 400 having a high power transistor device with a low gate resistance.

The integrated chip 400 comprises an isolation region 108 disposed within a substrate 101 and surrounding an active area 110. A gate structure 112 is disposed over the substrate 101. The gate structure 112 comprises a base region 112b and one or more gate extension fingers 112e protruding laterally outward from a sidewall of the base region 112b along a first direction 124. The one or more gate extension fingers 112e separate one or more source contacts 116 and one or more drain contacts 118 that are over the active area 110.

A first interconnect layer is arranged over the substrate 101 and comprises one or more first gate interconnects 402a and one or more first source/drain interconnects 402b. The one or more first gate interconnects 402a are disposed directly over a first plurality of conductive contacts 120 on the base region 112b and the one or more gate extension fingers 112e and extend in parallel (e.g., along the first direction) to the one or more gate extension fingers 112e. In some embodiments, the one or more first gate interconnects 402a respectively have a lower surface facing the substrate 101 and contacting the first plurality of conductive contacts on the base region 112b and one of the one or more gate extension fingers 112e. The one or more first source/drain interconnects 402b are arranged directly over the one or more source contacts 116 and/or the one or more drain contacts 118. In some embodiments, the one or more first gate interconnects 402a extend in parallel to the one or more first source/drain interconnects 402b. A second interconnect layer is arranged over the first interconnect layer. The second interconnect layer comprises one or more second source/drain interconnects 406, which are coupled to the one or more first source/drain interconnects 402b by way of one or more interconnect vias 404.

Figure 4B:
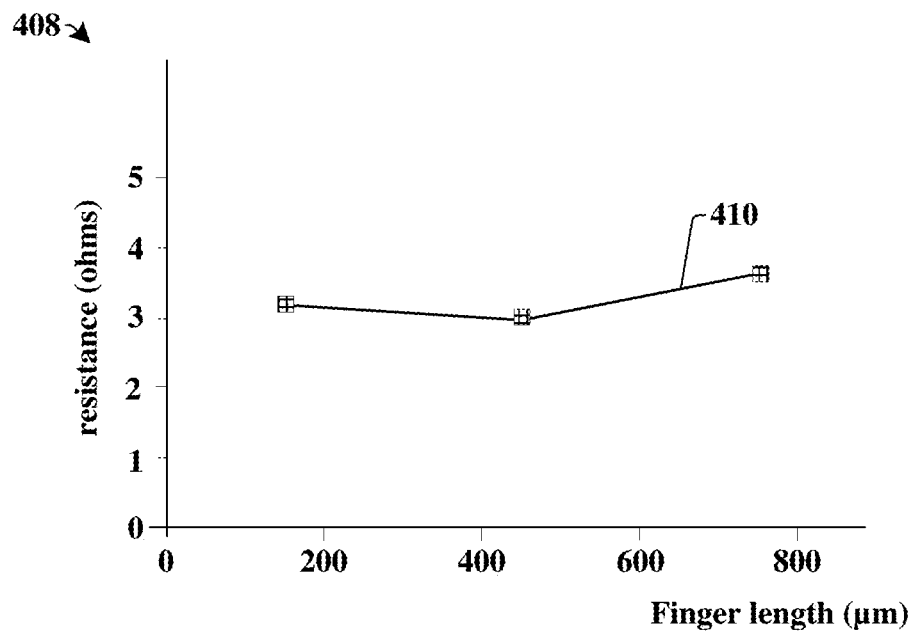
FIG. 4B illustrates some embodiments of a graph showing a resistance of a gate extension finger as a function of length for the disclosed high power transistor device of FIG. 4A.

Having the one or more first gate interconnects 402a coupled to the first plurality of conductive contacts 120 on the base region 112b and the one or more gate extension fingers 112e provides for an alternative path for current to flow to different parts of the one or more gate extension fingers 112e, thereby resulting in relatively low gate resistance for relatively long gate extension fingers (e.g., gate extension fingers having a length greater than approximately 500 μm, greater than approximately 750 μm, etc.). For example, FIG. 4B illustrates a graph 408 showing some exemplary embodiments of a resistance 410 of a gate extension finger (shown on y-axis) as a function of a length of the gate extension finger (shown on x-axis). As shown in graph 408, the resistance 410 increases by less than or equal to approximately 12.5% as a length of the gate extension finger increases from approximately 150 μm to approximately 750 μm. For example, the resistance 410 increases from approximately 3.2Ω at a length of 150 μm to approximately 3.6Ω at a length of 750 μm.

Figure 5A:
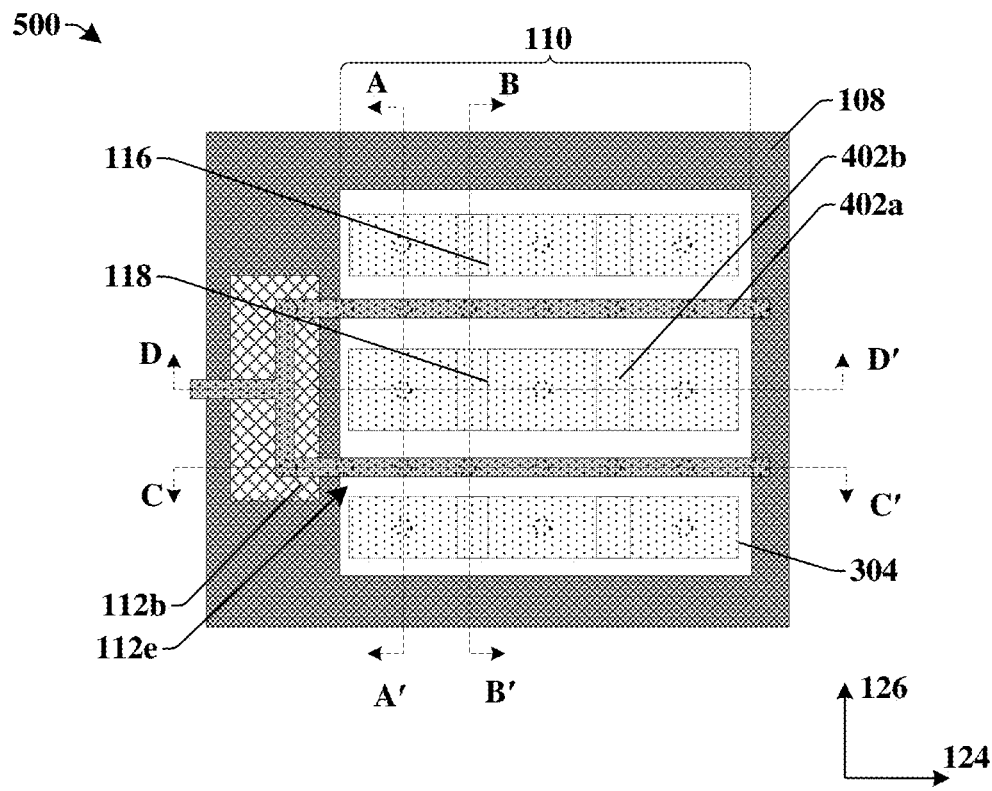

FIG. 5A illustrates a top-view 500 of some additional embodiments of an integrated chip having a high power transistor device with a relatively low gate resistance. FIGS. 5B-5E illustrate cross-sectional views of the integrated chip of FIG. 5A taken along different cross-sectional lines. FIG. 5B illustrates a cross-sectional view 502 taken along line A-A' of FIG. 5A, FIG. 5C illustrates a cross-sectional view 504 taken along line B-B' of FIG. 5A, FIG. 5D illustrates a cross-sectional view 506 taken along line C-C' of FIG. 5A, and FIG. 5E illustrates a cross-sectional view 508 taken along line D-D' of FIG. 5A. It will be appreciated that the top-view 500 of FIG. 5A does not illustrate upper interconnects so as to simplify the top-view.

The integrated chip comprises an isolation region 108 extending along a closed and unbroken path surrounding an active area 110. A gate structure 112 is disposed over the substrate 101. The gate structure 112 comprises a base region 112b and one or more gate extension fingers 112e protruding outward from a sidewall of the base region 112b along a first direction 124. The one or more gate extension fingers 112e extend between one or more source contacts 116 and one or more drain contacts 118 that are over the active area 110. In some embodiments the gate structure 112, the one or more source contacts 116, and/or one or more drain contacts 118 may be disposed within recesses in the substrate 101, so that a part of the gate structure 112, the one or more source contacts 116, and/or the one or more drain contacts 118 are below a top of the substrate 101.

A first interconnect layer is disposed within a dielectric structure 132 over the substrate 101. The first interconnect layer comprises one or more first gate interconnects 402a coupled to the gate structure 112 by way of a first plurality of conductive contacts 120 and one or more first source/drain interconnects 402b coupled to the one or more source contacts 116 and/or the one or more drain contacts 118 by a second plurality of conductive contacts 304. A second interconnect layer is disposed within the dielectric structure 132 over the first interconnect layer. The second interconnect layer comprises one or more second source/drain interconnects 406 coupled to the one or more first source/drain interconnects 402b by a plurality of interconnect vias 404. In some embodiments, the first plurality of conductive contacts 120, the second plurality of conductive contacts 304, the first interconnect layer, the plurality of interconnect vias 404, and the second interconnect layer may comprise tungsten, aluminum, copper, ruthenium, and/or the like. In some embodiments, the dielectric structure 132 may comprise a plurality of stacked inter-level dielectric (ILD) layers 132a-132c. In some embodiments, the plurality of stacked ILD layers 132a-132c may comprise a nitride (e.g., silicon nitride, silicon oxynitride), a carbide (e.g., silicon carbide), an oxide (e.g., silicon oxide), borosilicate glass (BSG), phosphoric silicate glass (PSG), borophosphosilicate glass (BPSG), a low-k oxide (e.g., a carbon doped oxide, SiCOH), or the like.

Figure 6A:
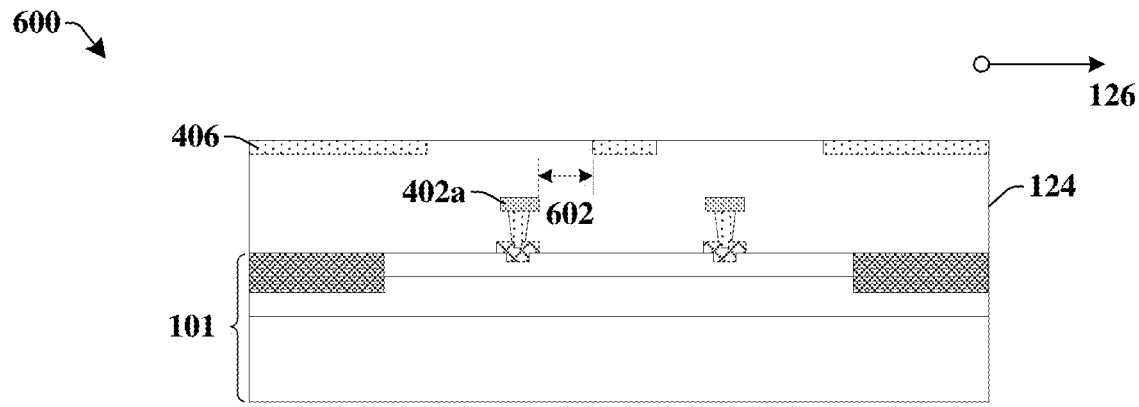
FIGS. 6A-6B illustrate cross-sectional views of some additional embodiments of integrated chips having different interconnect configurations coupled to a disclosed high power transistor device.

It will be appreciated that in various embodiments, a width of the one or more second source/drain interconnects 406 along the second direction 126 may vary. For example, FIG. 6A illustrates a cross-sectional view 600 of some embodiments of an integrated chip comprising a one or more second source/drain interconnects 406 having a relatively small width along the second direction 126. As shown in cross-sectional view 600, the one or more second source/drain interconnects 406 are laterally separated from an outermost sidewall of the one or more first gate interconnects 402a by a non-zero distance 602. Because the one or more second source/drain interconnects 406 are laterally separated from an outermost sidewall of the one or more first gate interconnects 402a, a capacitance between the one or more first gate interconnects 402a and the one or more second source/drain interconnects 406 is reduced, but a resistance of the one or more second source/drain interconnects 406 is increased.

Figure 6B:
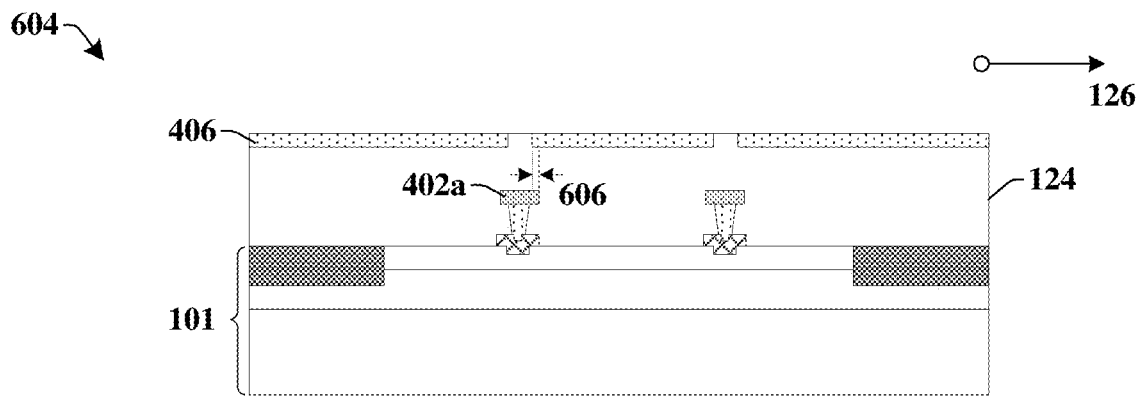

FIG. 6B illustrates a cross-sectional view 604 of some embodiments of an integrated chip comprising one or more second source/drain interconnects 406 having a relatively large width along the second direction 126. As shown in cross-sectional view 604, the one or more second source/drain interconnects 406 laterally overlap the one or more first gate interconnects 402a over a non-zero distance 606. Because the one or more second source/drain interconnects 406 laterally overlap the one or more first gate interconnects 402a, a capacitance between the one or more first gate interconnects 402a and the one or more second source/drain interconnects 406 is increased, but a resistance of the one or more second source/drain interconnects 406 is reduced.

Figure 7A:
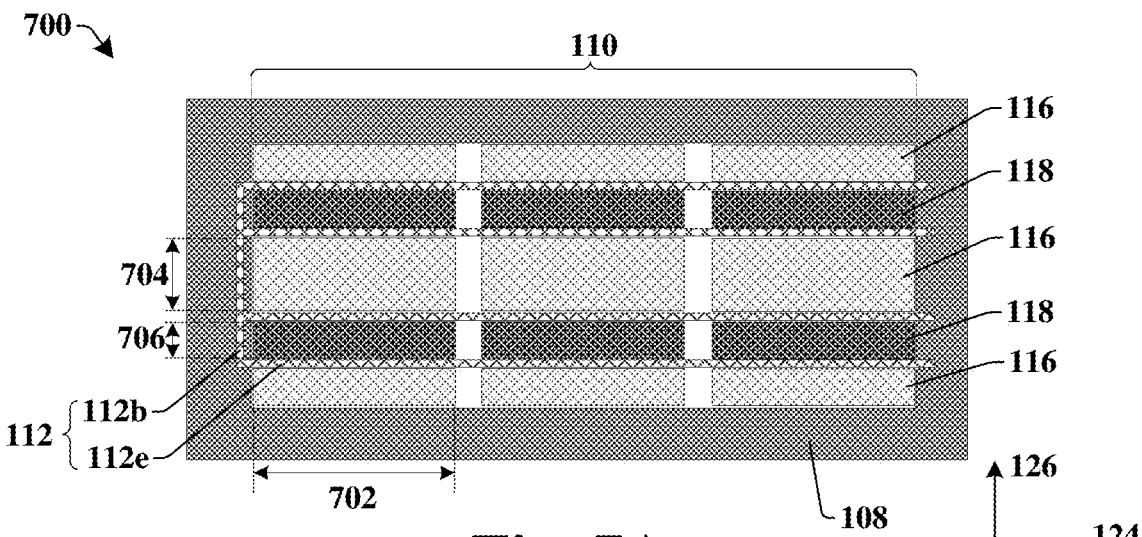
FIGS. 7A-7C illustrate plan views of some additional embodiments of an integrated chip having a disclosed high power transistor device at different heights over a substrate.
Figure 7B:
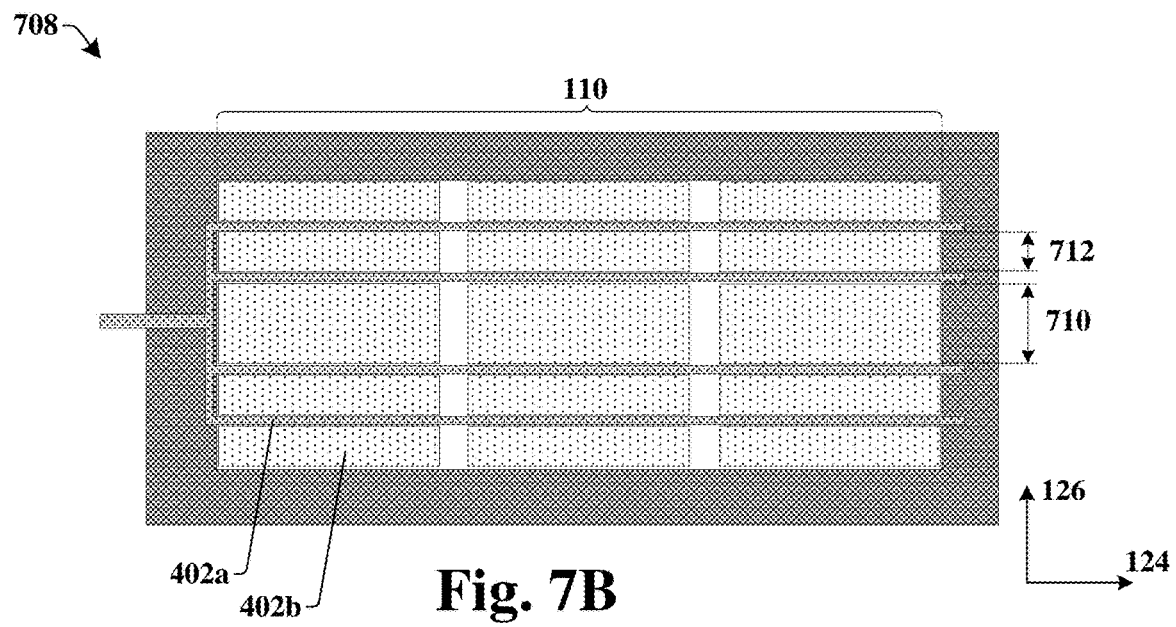
Figure 7C:
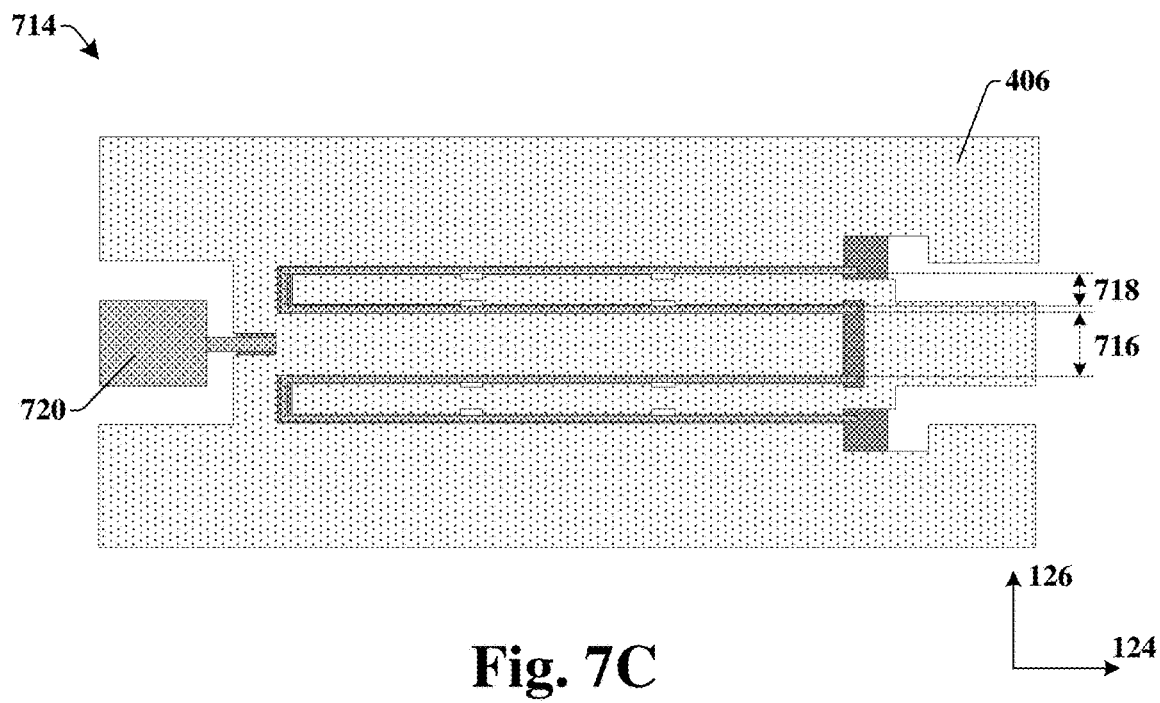

FIGS. 7A-7C illustrate plan views of some additional embodiments of an integrated chip having a disclosed high power transistor device at different heights over a substrate.

FIG. 7A illustrates a plan view 700 of the integrated chip taken at a first height over a substrate. As shown in plan view 700, an isolation region 108 extends around an active area 110. A gate structure 112 comprises a base region 112b disposed over the isolation region 108 and one or more gate extension fingers 112e laterally extending outward from a sidewall of the base region 112b along a first direction 124 and past opposing sides of the active area 110. One or more source contacts 116 and one or more drain contacts 118 are disposed within the active area 110. In some embodiments, the one or more source contacts 116 and/or the one or more drain contacts 118 may have a length 702 measured along the first direction 124. In some embodiments, the length 702 may be in a range of less than approximately 600 μm, less than approximately 500 μm, or other similar values. In some embodiments, one or more of the one or more source contacts 116 have a first width 704 measured along a second direction 126 and one or more of the one or more drain contacts 118 have a second width 706 measured along the second direction 126. In some embodiments, the first width 704 may be larger than the second width 706. In some embodiments, the first width 704 may be less than approximately 600 μm, less than approximately 500 μm, or other similar values. In some embodiments, the second width 706 may be less than approximately 300 μm, less than approximately 200 μm, or other similar values.

FIG. 7B illustrates a plan view 708 of the integrated chip taken at a second height over the substrate. As shown in plan view 708, a first interconnect layer extends over the one or more source contacts (e.g., 116 of FIG. 7A), the one or more drain contacts (e.g., 118 of FIG. 7A), and the gate structure (e.g., 112 of FIG. 7A). The first interconnect layer comprises a first gate interconnect 402a over the gate structure and a first source/drain interconnect 402b over the one or more source contacts and the one or more drain contacts. The first source/drain interconnect 402b has a third width 710 over the one or more source contacts and a fourth width 712 over the one or more drain contacts, as measured along the second direction 126. In some embodiments, the third width 710 may be less than approximately 600 μm, less than approximately 500 μm, less than approximately 300 μm, or other similar values. In some embodiments, the fourth width 712 may be less than approximately 300 μm, less than approximately 200 μm, or other similar values.

FIG. 7C illustrates a plan view 714 of the integrated chip taken at a third height over the substrate. As shown in plan view 714, a second interconnect layer is over the first interconnect layer. The second interconnect layer comprises second source/drain interconnects 406 over the first source/drain interconnects 402b. The second source/drain interconnects 406 have a fifth width 716 directly over the one or more source contacts and a sixth width 718 directly over the one or more drain contacts, as measured along the second direction 126. In some embodiments, the fifth width 716 may be less than approximately 600 μm, less than approximately 500 μm, less than approximately 300 μm, or other similar values. In some embodiments, the sixth width 718 may be less than approximately 300 μm, less than approximately 200 μm, or other similar values. The second interconnect layer further comprises a second gate interconnect 720 over the first gate interconnects (e.g., 402a of FIG. 7B) and the base region (e.g., 112b of FIG. 7A). The second gate interconnect 720 is coupled to the first gate interconnects by way of the one or more interconnect vias 404.

Figure 8A:
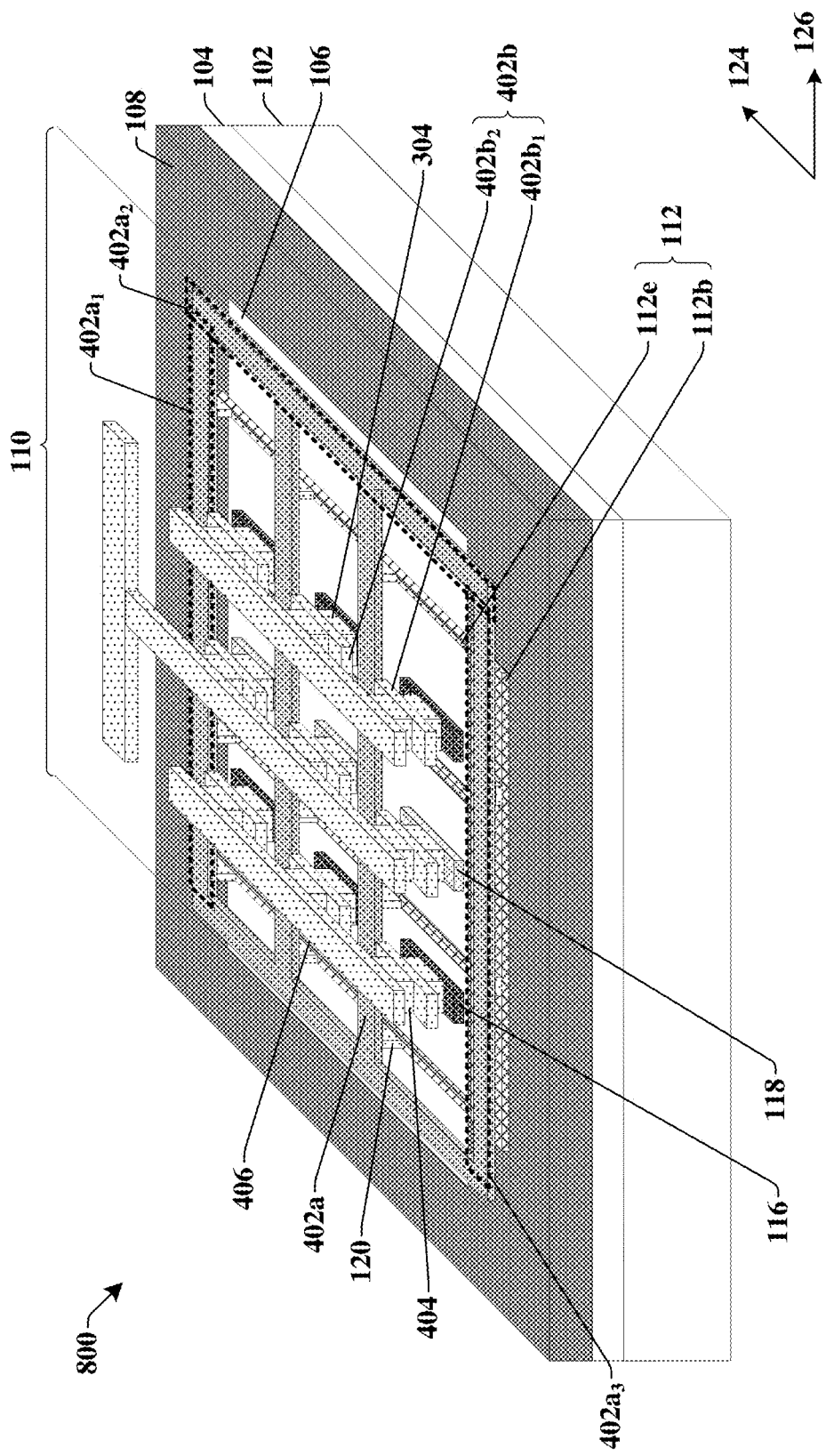
FIG. 8A illustrates a three-dimensional view of some additional embodiments of an integrated chip having a high power transistor device with a low gate resistance.

FIG. 8A illustrates a three-dimensional view of some additional embodiments of an integrated chip 800 having a high power transistor device with a low gate resistance.

The integrated chip 800 comprises an isolation region 108 disposed within a substrate 101 and surrounding an active area 110. A gate structure 112 is disposed over the substrate 101. The gate structure 112 comprises a base region 112b and one or more gate extension fingers 112e protruding laterally outward from a sidewall of the base region 112b along a first direction 124. The one or more gate extension fingers 112e separate one or more source contacts 116 and one or more drain contacts 118 that are over the active area 110. In some embodiments, the one or more source contacts 116 and/or the one or more drain contacts 118 are separated from one another along a second direction 126 that is perpendicular to the first direction 124. In some embodiments, the one or more source contacts 116 and/or the one or more drain contacts 118 respectively comprise discrete source contact segments and/or drain contact segments that are separated along the first direction 124.

A first interconnect layer is disposed over the substrate 101. The first interconnect layer comprises first gate interconnects 402a coupled to the gate structure 112 by way of a first plurality of conductive contacts 120 that are arranged to span a majority of a length of the one or more gate extension fingers 112e. The first interconnect layer further comprises first source/drain interconnects 402b that are coupled to the one or more source contacts 116 and the one or more drain contacts 118 by way of a second plurality of conductive contacts 304. The first source/drain interconnects 402b have discrete parts $402b_1$-$402b_2$ (e.g., source/drain interconnect parts $402b_1$-$402b_2$) that are aligned along the first direction 124 and that are separated from one another by the first gate interconnects 402a. A second interconnect layer is arranged over the first interconnect layer and comprises second source/drain interconnects 406 that are coupled to the first source/drain interconnects 402b by a plurality of interconnect vias 404. The second source/drain interconnects 406 continuously extend past the discrete parts $402b_1$-$402b_2$ of the first source/drain interconnects 402b and over the first gate interconnects 402a.

In some embodiments, the first gate interconnects 402a comprise first gate interconnect segments $402a_1$ extending along the second direction 126 and second gate interconnect segments $402a_2$ extending along the first direction 124. The second gate interconnect segments $402a_2$ are coupled to opposing ends of the first gate interconnect segments $402a_1$. The first gate interconnect segments $402a_1$ extends in the second direction 126 between outermost ones of the one or more gate extension fingers 112e. In some embodiments, the first gate interconnect segments $402a_1$ extend between the discrete parts $402b_1$-$402b_2$ of the first source/drain interconnects 402b. For example, in some embodiments the first gate interconnect segments $402a_1$ may extend between a first source/drain interconnect part $402b_1$ disposed over a first source contact segment and a second source/drain interconnect part $402b_2$ disposed over a second source contact segment.

In some embodiments, the active area 110 may continuously extend in the first direction 124 past the first gate interconnect segments $402a_1$, while in other embodiments the isolation region 108 may extend under the first gate interconnect segments $402a_1$, so as to break the active area 110 into a plurality of discrete active area regions. The first gate interconnect segments $402a_1$ contact one of the first plurality of conductive contacts 120 on different ones of the one or more gate extension fingers 112e. The second gate interconnect segments $402a_2$ run along an outer perimeter of the gate structure 112 and couple the first gate interconnect segments $402a_1$ to a base gate interconnect segment $402a_3$ that overlies and is coupled to the base region 112b of the gate structure 112. By having the first gate interconnect segments $402a_1$ coupled to the base gate interconnect segment $402a_3$, the first gate interconnects 402a are able to provide an alternative path for current to flow to different parts of the one or more gate extension fingers 112e, thereby allowing a resistance of a relatively long gate extension finger (e.g., a gate extension finger having a length of greater than approximately 500 μm, greater than approximately 750 μm, etc.) to be kept relatively low. Furthermore, because the first gate interconnect segments $402a_1$ are outside of the gate structure 112, the first gate interconnect segments $402a_1$ may have a greater width than gate interconnects directly over the one or more gate extension fingers 112e (e.g., as shown in FIG. 4A), thereby further reducing a resistance of the one or more gate extension fingers 112e.

Figure 8B:
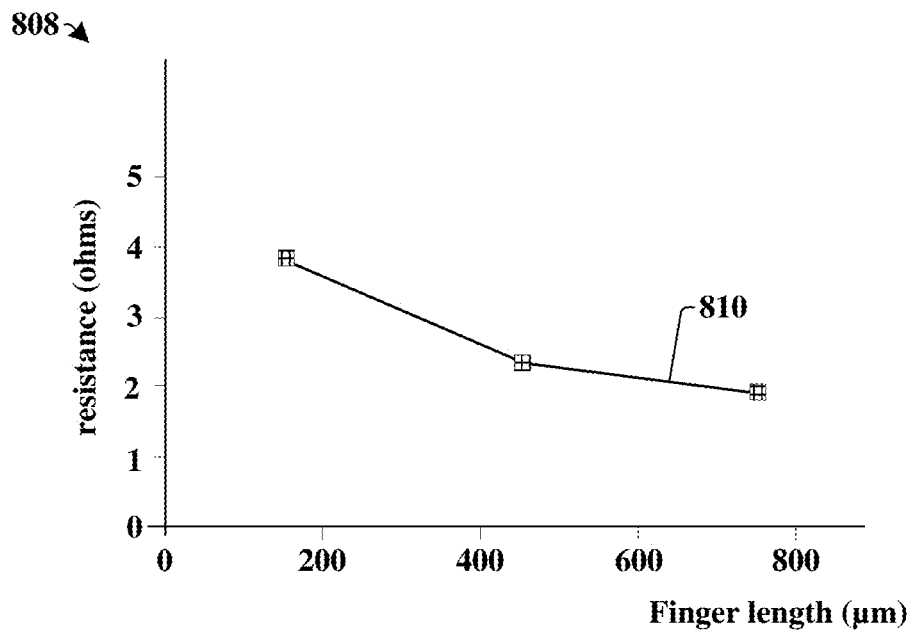
FIG. 8B illustrates some embodiments of a graph showing a resistance of a gate extension finger as a function of length for the disclosed high power transistor device of FIG. 8A.

FIG. 8B illustrates a graph 808 showing some exemplary embodiments of a resistance 810 of a gate extension finger (shown on y-axis) as a function of a length of the gate extension finger (shown on x-axis). As shown in graph 808, the resistance 810 decreases by approximately 45% or more as a length of the gate extension finger increases from approximately 150 μm to approximately 750 μm. For example, the resistance 810 increases from approximately 3.9Ω at a length of 150 μm to approximately 1.98Ω at a length of 750 μm.

Figure 9A:
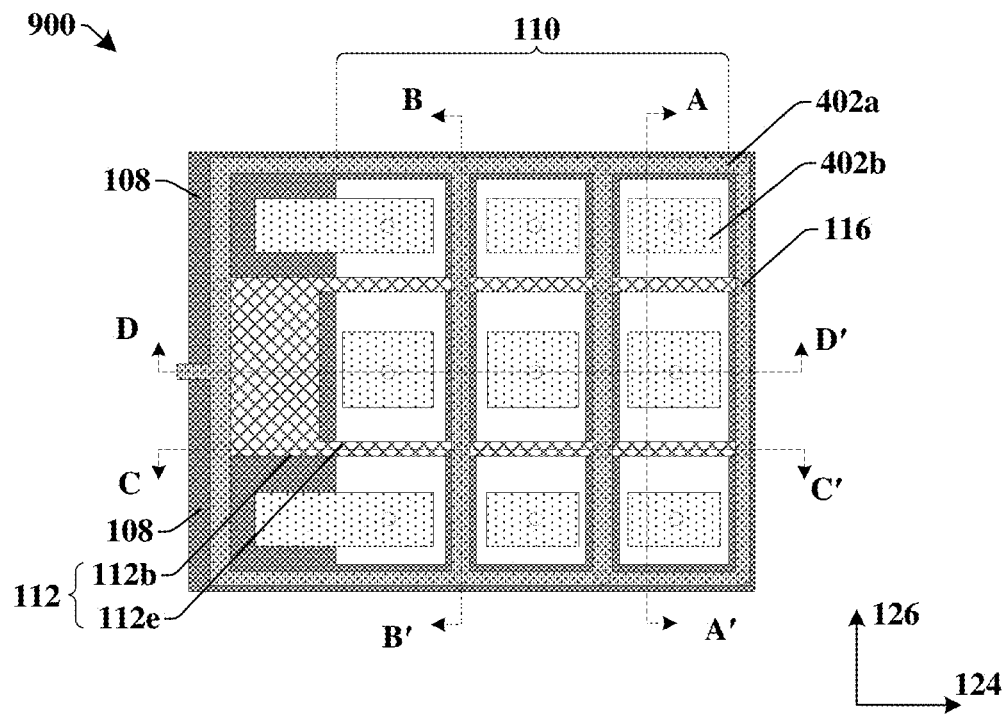

FIG. 9A illustrates a top-view 900 of some additional embodiments of an integrated chip having a disclosed high power transistor device. FIGS. 9B-9E illustrate cross-sectional views of the integrated chip of FIG. 9A taken across different cross-sectional lines. FIG. 9B illustrates a cross-sectional view 902 taken along line A-A' of FIG. 9A, FIG. 9C illustrates a cross-sectional view 904 taken along line B-B' of FIG. 9A, FIG. 9D illustrates a cross-sectional view 906 taken along line C-C' of FIG. 9A, and FIG. 9E illustrates a cross-sectional view 908 taken along line D-D' of FIG. 9A. It will be appreciated that the top-view 900 of FIG. 9A does not illustrate upper interconnects so as to simplify the top-view.

The integrated chip comprises an isolation region 108 disposed within a substrate 101. The isolation region 108 extends along a closed and unbroken path that surrounds an active area 110 within the substrate 101. A gate structure 112 is disposed over the substrate 101. The gate structure 112 comprises a base region 112b and one or more gate extension fingers 112e protruding laterally outward from a sidewall of the base region 112b along a first direction 124. The one or more gate extension fingers 112e separate one or more source contacts 116 and one or more drain contacts 118 that are over the active area 110. In some embodiments, the one or more source contacts 116 and or the one or more drain contacts 118 are separated from another along a second direction 126 that is perpendicular to the first direction 124.

A first interconnect layer is disposed within a dielectric structure 132 over the substrate 101. The first interconnect layer comprises one or more first gate interconnects 402a coupled to the gate structure 112 by way of a first plurality of conductive contacts 120 and one or more first source/drain interconnects 402b coupled the one or more source contacts 116 and/or the one or more drain contacts 118 by a second plurality of conductive contacts 304. A second interconnect layer is disposed within the dielectric structure 132 over the first interconnect layer. The second interconnect layer comprises one or more second source/drain interconnects 406 coupled to the one or more first source/drain interconnects 402b by a plurality of interconnect vias 404 and a second gate interconnect 720 coupled to the one or more first gate interconnects 402a by the plurality of interconnect vias 404.

Figure 10A:
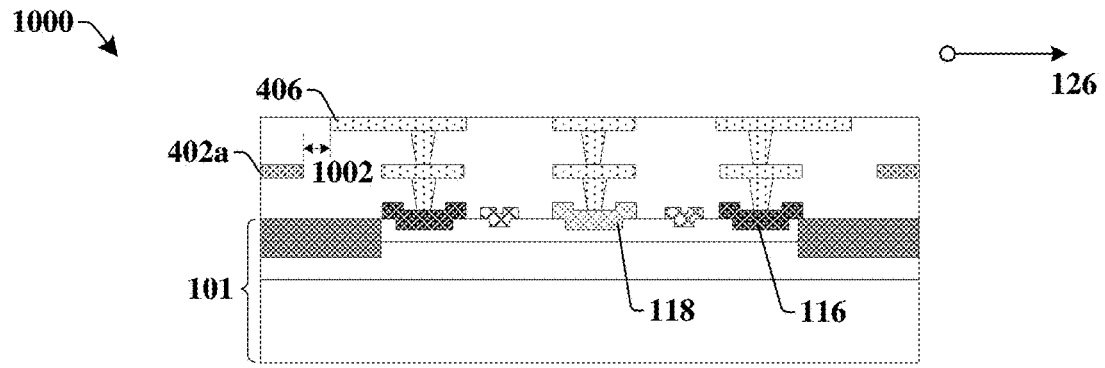
FIGS. 10A-10B illustrate cross-sectional views of some additional embodiments of integrated chips having different interconnect configurations coupled to a disclosed high power transistor device.

It will be appreciated that in various embodiments, a width of the one or more second source/drain interconnects 406 may vary along the second direction 126. For example, FIG. 10A illustrates a cross-sectional view 1000 of some embodiments of an integrated chip comprising one or more second source/drain interconnects 406 having a relatively small width along a second direction. As shown in cross-sectional view 1000, the one or more second source/drain interconnects 406 are laterally separated from an outermost sidewall of the one or more first gate interconnects 402a by a non-zero distance 1002. Because the one or more second source/drain interconnects 406 are laterally separated from the one or more first gate interconnects 402a, a capacitance between the one or more first gate interconnects 402a and the one or more second source/drain interconnects 406 is reduced, but a resistance of the one or more second source/drain interconnects 406 is increased.

Figure 10B:
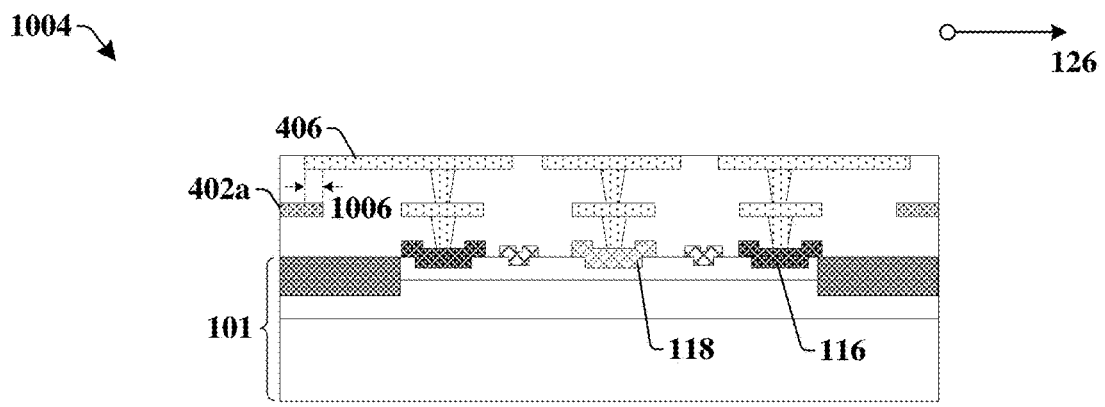

FIG. 10B illustrates a cross-sectional view 1004 of some embodiments of an integrated chip comprising one or more second source/drain interconnects 406 having a relatively large width along the second direction 126. As shown in cross-sectional view 1004, the one or more second source/drain interconnects 406 laterally overlap the one or more first gate interconnects 402a over a non-zero distance 1006. Because the one or more second source/drain interconnects 406 laterally overlap the one or more first gate interconnects 402a, a capacitance between the one or more first gate interconnects 402a and the one or more second source/drain interconnects 406 is increased, but a resistance of the one or more second source/drain interconnects 406 is reduced.

Figure 11A:
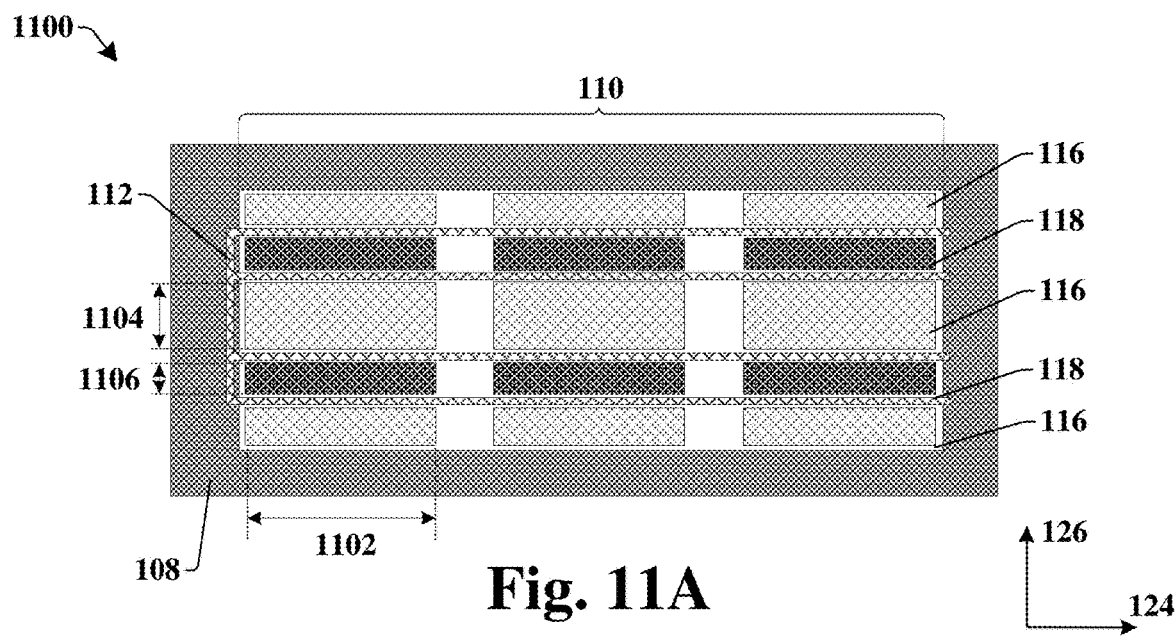
FIGS. 11A-11C illustrate plan views of some additional embodiments of an integrated chip having a disclosed high power transistor device at different heights over a substrate.
Figure 11B:
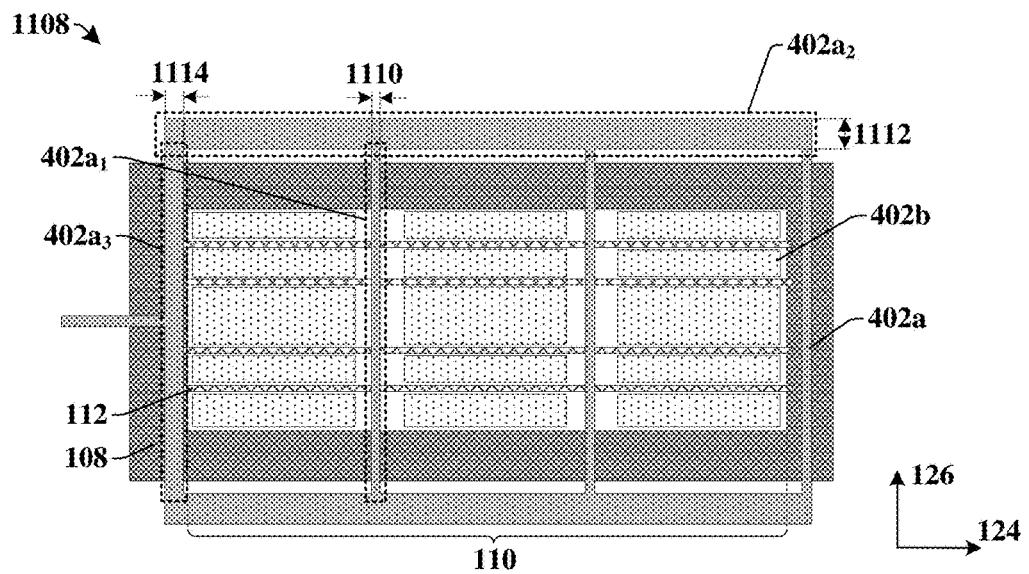
Figure 11C:
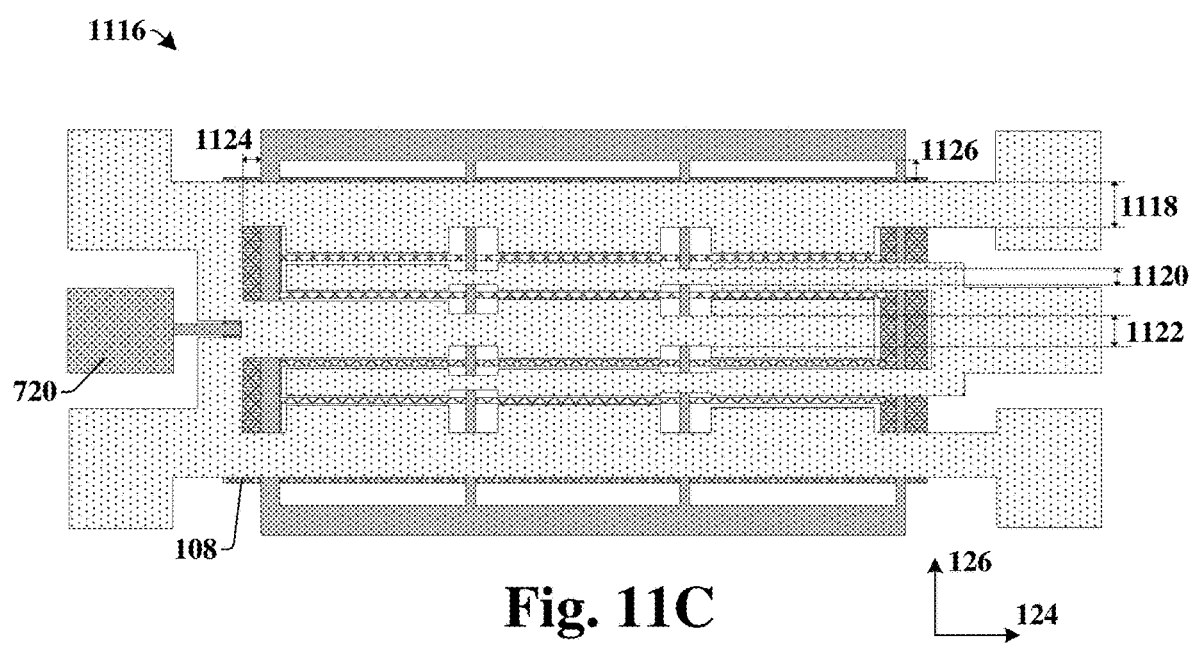

FIGS. 11A-11C illustrate plan views of some additional embodiments of an integrated chip having a disclosed high power transistor device at different heights over a substrate.

FIG. 11A illustrates a plan view 1100 of the integrated chip taken at a first height over a substrate. As shown in plan view 1100, an isolation region 108 extends around an active area 110. A gate structure 112 comprises a base region 112b disposed over the isolation region 108 and one or more gate extension fingers 112e extending outward from the base region 112b along a first direction 124 and past opposing sides of the active area 110. One or more source contacts 116 and one or more drain contacts 118 are disposed within the active area 110. In some embodiments, the one or more source contacts 116 and the one or more drain contacts 118 may have a length 1102 measured along the first direction 124. In some embodiments, the length 1102 may be less than approximately 600 µm, less than approximately 500 µm, or other similar values. In some embodiments, one or more of the one or more source contacts 116 have a first width 1104 measured along a second direction 126 and one or more of the one or more drain contacts 118 have a second width 1106 measured along the second direction 126. In some embodiments, the first width 1104 may be larger than the second width 1106. In some embodiments, the first width 1104 may be less than approximately 600 µm, less than approximately 500 µm, or other similar values. In some embodiments, the second width 1106 may be less than approximately 300 µm, less than approximately 200 µm, or other similar values.

FIG. 11B illustrates a plan view 1108 of the integrated chip taken at a second height over the substrate. As shown in plan view 1108, a first interconnect layer extends over the one or more source contacts (e.g., 116 of FIG. 11A), the one or more drain contacts (e.g., 118 of FIG. 11A), and the gate structure (e.g., 112 of FIG. 11A). The first interconnect layer comprises one or more first gate interconnects 402a directly over the gate extension fingers and a first source/drain interconnect 402b directly over the one or more source contacts and the one or more drain contacts. The one or more first gate interconnects 402a comprise first gate interconnect segments $402a_1$ having a third width 1110, second gate interconnect segments $402a_2$ having a fourth width 1112, and a base gate interconnect segment $402a_3$ having a fifth width 1114. In some embodiments, the third width 1110, the fourth width 1112, and the fifth width 1114 are less than or equal to approximately 300 µm, less than approximately 200 µm, or other similar values. In some embodiments, the third width 1110, the fourth width 1112, and the fifth width 1114 may be larger than a width of the gate extension fingers (e.g., 112e of FIG. 11A). In some embodiments, the third width 1110 may be less than or equal to the fourth width 1112 and/or the fifth width 1114.

FIG. 11C illustrates a plan view 1116 of the integrated chip taken at a third height over the substrate. As shown in plan view 1116, a second interconnect layer is over the first source/drain interconnects 402b. The second interconnect layer comprises second source/drain interconnects 406 over the first source/drain interconnects 402b and a second gate interconnect 720 over the one or more first gate interconnects (e.g., 402a of FIG. 11B) and the base region (e.g., 112b of FIG. 11A). The second source/drain interconnects 406 have a sixth width 1118 outside of the active area, a seventh width 1120 directly over the one or more drain contacts, and an eighth width 1122 directly over the one or more source contacts. In some embodiments, the sixth width 1118, the seventh width 1120, and the eighth width 1122 are less than or equal to approximately 300 µm, less than approximately 200 µm, or other similar values.

In some embodiments, a first gap 1124 may extend along the first direction 124 between first gate interconnects 402a and the second source/drain interconnects 406. In some embodiments, the first gap 1124 may have a distance of less than or equal to approximately 100 µm, less than approximately 75 µm, or other similar values. In some embodiments, a second gap 1126 may extend along the second direction 126 between first gate interconnects 402a and the second source/drain interconnects 406. In some embodiments, the second gap 1126 may have a distance of less than or equal to approximately 100 µm, less than approximately 75 µm, or other similar values.

FIGS. 12A-16C illustrate cross-sectional views 1200-1606 of some embodiments of a method of forming an integrated chip having a high power transistor device with a low gate resistance. Although FIGS. 12A-16C are described in relation to a method, it will be appreciated that the structures disclosed in FIGS. 12A-16C are not limited to such a method, but instead may stand alone as structures independent of the method.

Figure 12A:
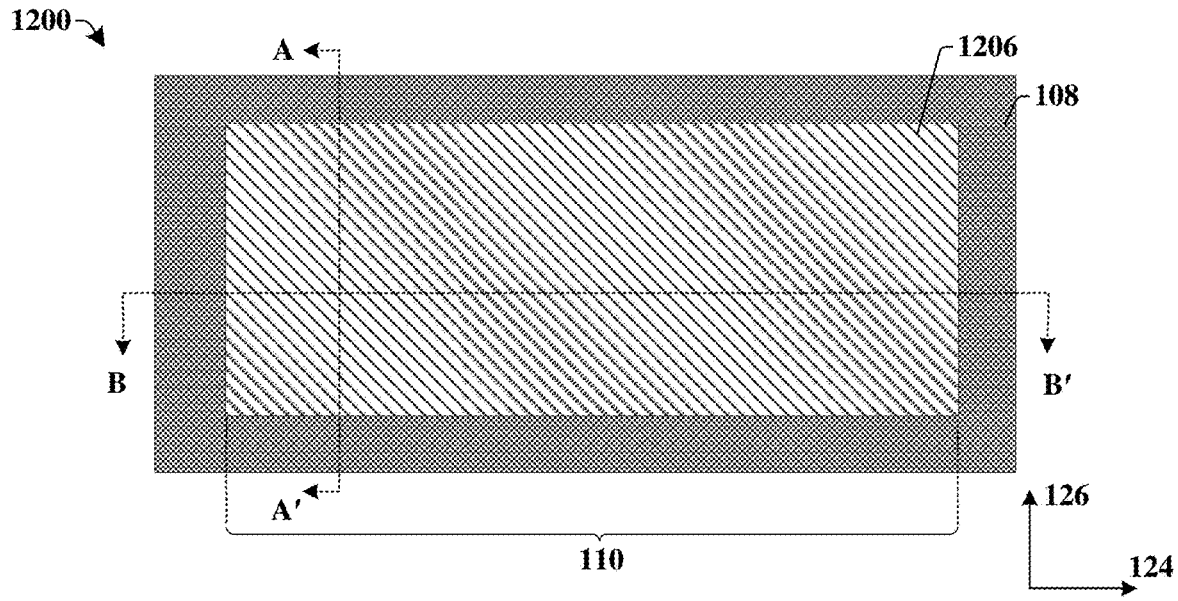
FIGS. 12A-16C illustrate some embodiments of a method of forming an integrated chip having a high power transistor device with a low gate resistance.
Figure 12B:
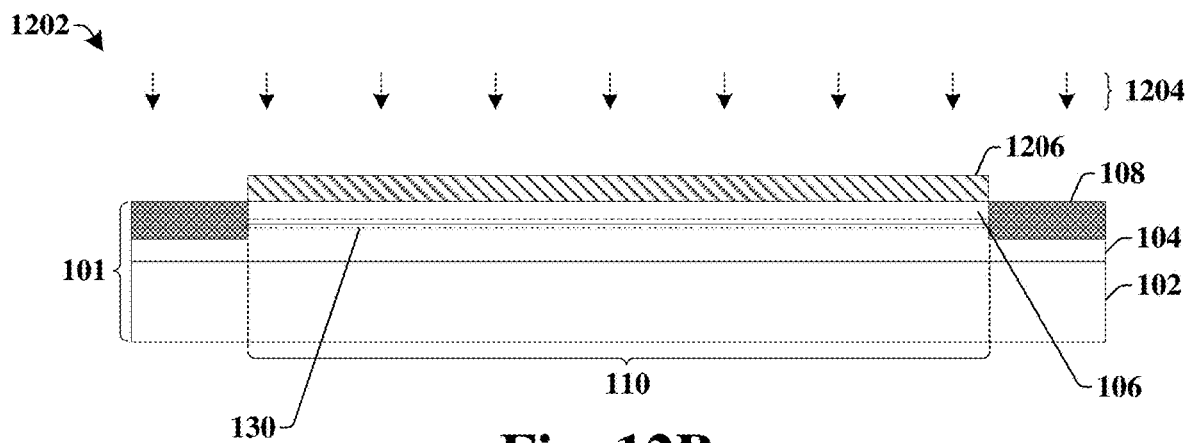
Figure 12C:
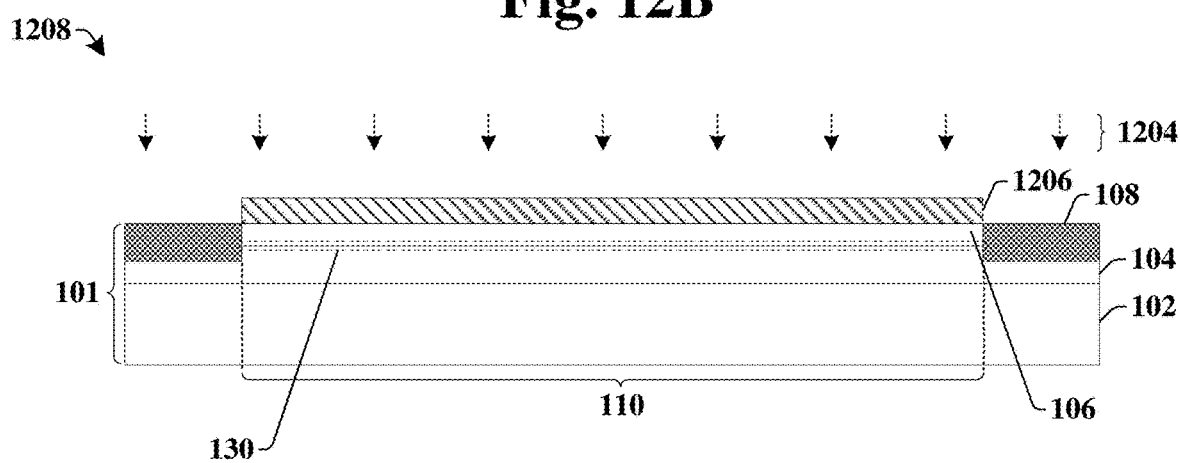

As shown in top-view 1200 of FIG. 12A, cross-sectional view 1202 of FIG. 12B (taken along line A-A'), and cross-sectional view 1208 of FIG. 12C (taken along line B-B'), a substrate 101 is formed. In some embodiments, the substrate 101 may be formed by forming one or more epitaxial layers over a base substrate 102. In some embodiments, the one or more epitaxial layers may comprise an active layer 104 formed over the base substrate 102 and a barrier layer 106 formed over the active layer 104. In some additional embodiments, a buffer layer (not shown) may be formed onto the base substrate 102 prior to forming the active layer 104 to mitigate lattice mismatch between the base substrate 102 and the active layer 104.

In various embodiments, the base substrate 102 may comprise silicon, silicon carbide, sapphire, or the like. In some embodiments, the active layer 104 may comprise GaN, GaAs, InGaAS, or the like. In various embodiments, the barrier layer 106 may comprise AlGaN, AlN, InAlGaN, InAlAs, InAlGaAs, InAlGaP, SiGe, or the like. In some embodiments, the active layer 104 and the barrier layer 106 may be formed onto the base substrate 102 by way of chemical vapor deposition processes, a physical vapor deposition process, or the like.

After forming the substrate 101, an isolation region 108 is formed within the substrate 101 to extend in a closed and unbroken path that surrounds an active area 110. The active area 110 continuously extends along a first direction 124 and along a second direction 126 that is perpendicular to the first direction 124. In some embodiments, the isolation region 108 may be formed by selectively implanting ions 1204 into the substrate 101 according to a mask 1206 (e.g., photoresist). The implanted ions 1204 damage the layers of the substrate 101. The damage to the layers of the substrate 101 prevents a 2DEG 130 from extending into the isolation region 108.

Figure 13A:
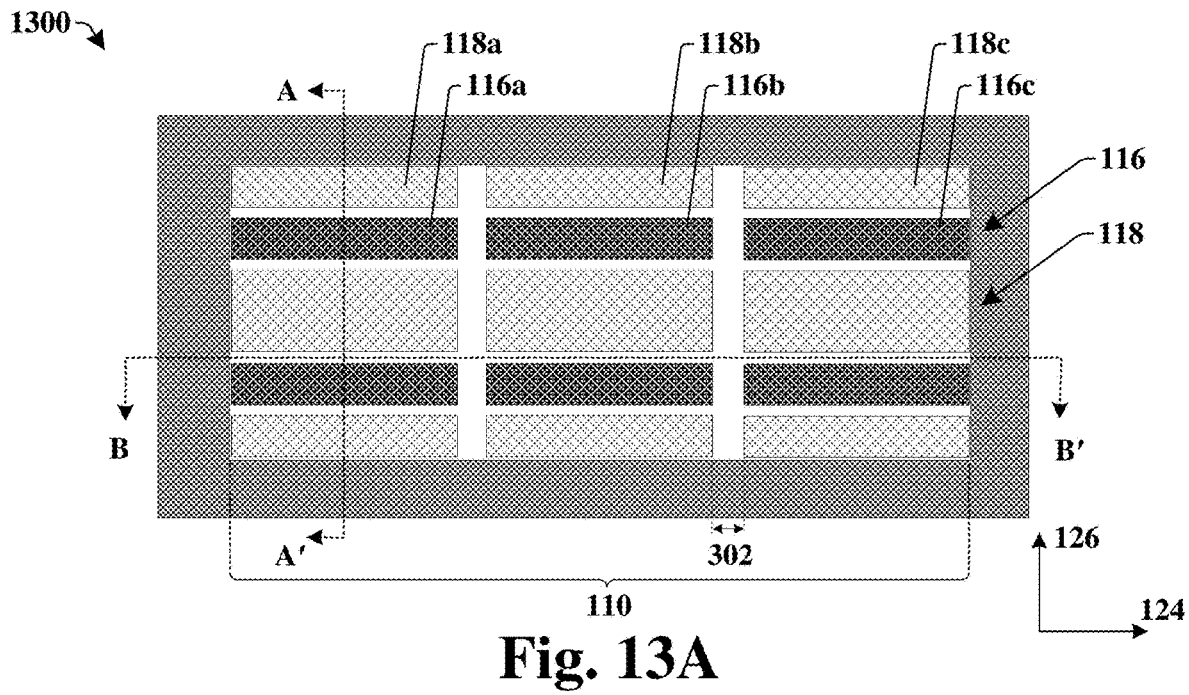
Figure 13B:
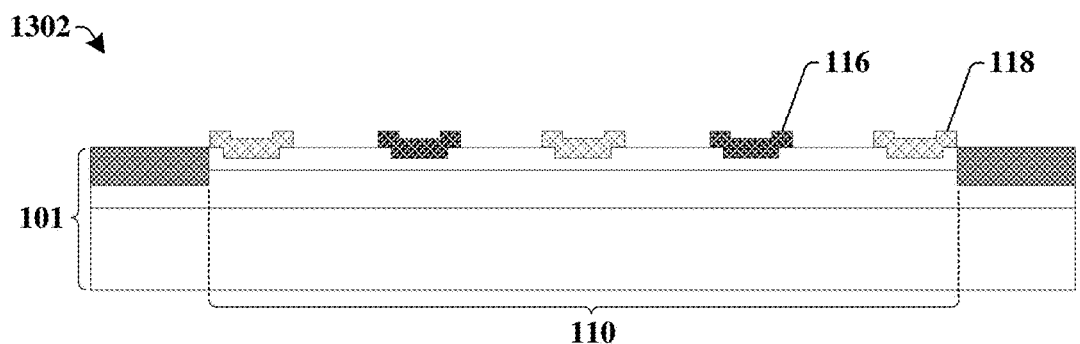
Figure 13C:
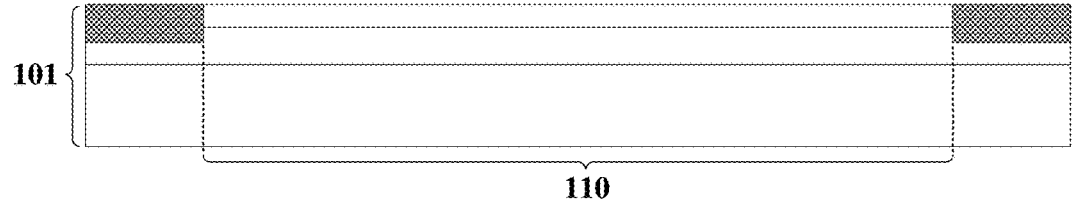

As shown in top-view 1300 of FIG. 13A, cross-sectional view 1302 of FIG. 13B (taken along line A-A'), and cross-sectional view 1304 of FIG. 13C (taken along line B-B'), one or more source contacts 116 and one or more drain contacts 118 are formed over the substrate 101 and within the active area 110. The one or more source contacts 116 are separated from the one or more drain contacts 118 along the second direction 126. In some embodiments, the one or more source contacts 116 may comprise discrete source contact segments 116a-116c that are separated from one another along the first direction 124 and the one or more drain contacts 118 may comprise discrete drain contact segments 118a-118c that are separated from one another along the first direction 124. In such embodiments, adjacent ones of the discrete source contact segments and/or drain contact segments may have sidewalls that are separated by a non-zero distance 302 that is directly over the active area 110.

In some embodiments, the one or more source contacts 116 and the one or more drain contacts 118 may be formed by depositing a first conductive material over the substrate 101. In some embodiments (not shown), the substrate 101 may be etched prior to depositing the first conductive material so that the first conductive material extends to within one or more source/drain contact recesses within the substrate 101. The first conductive material is subsequently patterned to define the one or more source contacts 116 and the one or more drain contacts 118. In various embodiments, the first conductive material may comprise a metal, such as aluminum, tungsten, titanium, cobalt, or the like.

Figure 14A:
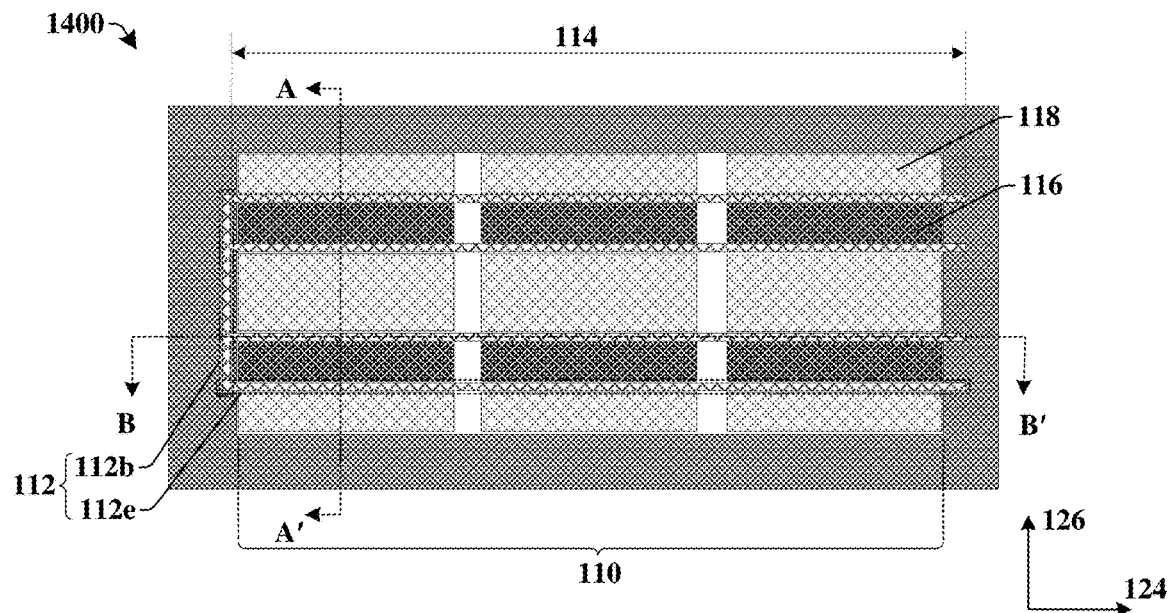
Figure 14B:
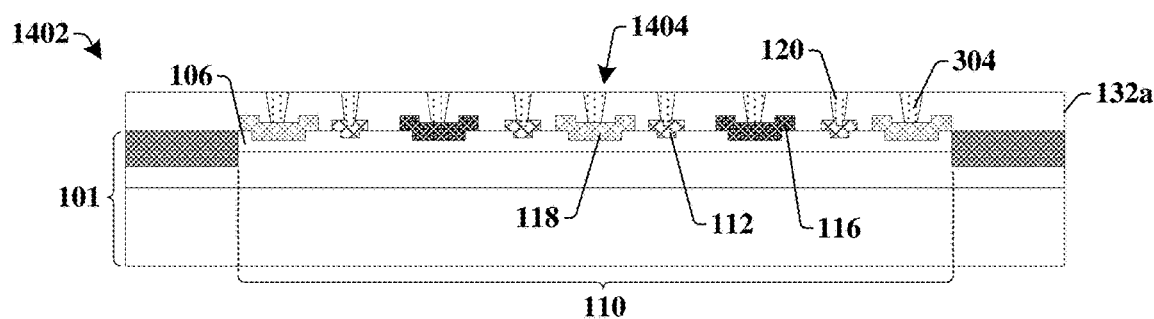
Figure 14C:
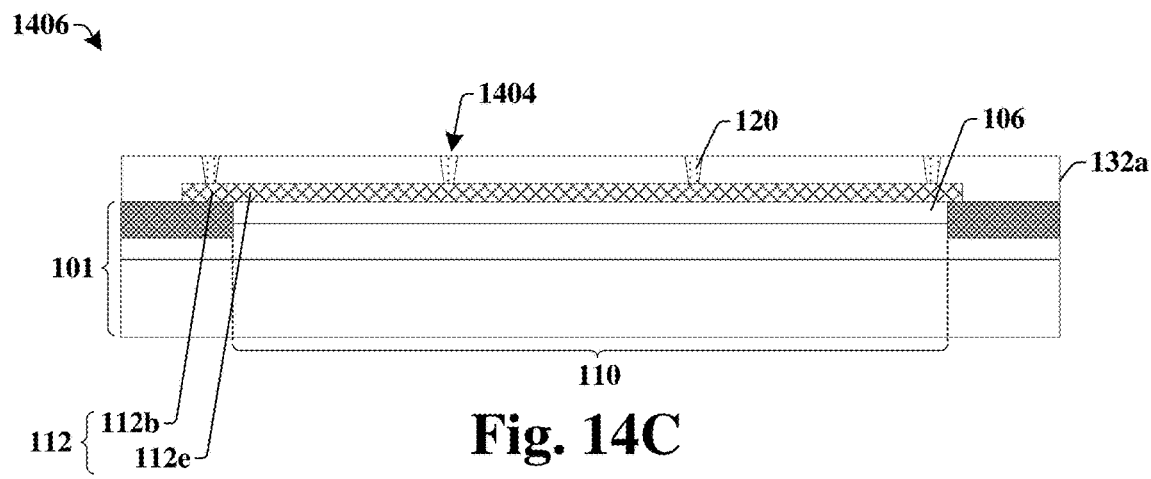

As shown in cross-sectional view 1400 of FIG. 14A, cross-sectional view 1402 of FIG. 14B (taken along line A-A'), and cross-sectional view 1406 of FIG. 14C (taken along line B-B'), a gate structure 112 is formed over the substrate 101 and between adjacent ones of the one or more source contacts 116 and the one or more drain contacts 118. In some embodiments, the gate structure 112 may be formed to have a base region 112b that extends along the second direction 126 and one or more gate extension fingers 112e that extend outward from a sidewall of the base region 112b along the first direction 124. In some embodiments, the one or more gate extension fingers 112e have a length 114 that extends in the first direction 124 past opposing edges of the active area 110.

In various embodiments, the gate structure 112 may be formed by depositing a second conductive material (e.g., polysilicon, a metal, etc.) over the substrate 101 and subsequently patterning the second conductive material to define the gate structure 112. In some embodiments (not shown), the substrate 101 may be etched prior to depositing the second conductive material so that the second conductive material extends to within one or more gate recesses within the substrate 101.

In some embodiments, after forming the gate structure 112, a first inter-level dielectric (ILD) layer 132a may be formed over the substrate 101 to cover the gate structure 112. The first ILD layer 132a is subsequently patterned to form contact openings 1404 that expose the one or more gate extension fingers 112e at multiple locations separated along the first direction 124. In some embodiments, the first ILD layer 132a may comprise a dielectric material (e.g., silicon oxide, borosilicate glass, or the like) formed by way of a deposition process (e.g., a chemical vapor deposition (CVD) process, a physical vapor deposition (PVD) process, sputtering, a plasma enhanced CVD (PE-CVD) process, or the like).

Conductive contacts are formed within the contact openings 1404. The conductive contacts comprise a first plurality of conductive contacts 120 formed on the gate structure 112 and a second plurality of conductive contacts 304 formed on the one or more source contacts 116 and/or the one or more drain contacts 118. The first plurality of conductive contacts 120 are separated along the first direction 124 and span a majority of the length 114 of the one or more gate extension fingers 112e (e.g., 50% of the length 114, 75% of the length 114, 90% of the length 114, or other similar values). In some embodiments, the first plurality of conductive contacts 120 and the second plurality of conductive contacts 304 may be formed by way of a damascene process. In some such embodiments, the contact openings 1404 are filled with a third conductive material (e.g., tungsten, copper, and/or aluminum). A first planarization process (e.g., a chemical mechanical planarization (CMP) process) is subsequently performed to remove excess of the third conductive material from over the first ILD layer 132a.

Figure 15A:
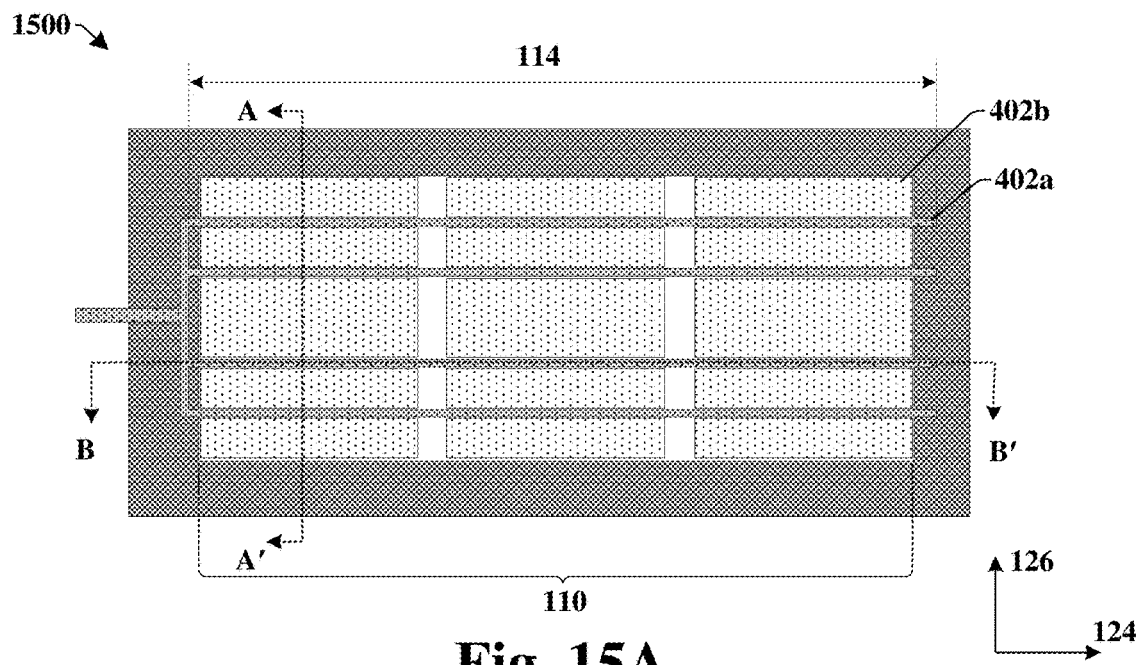
Figure 15B:
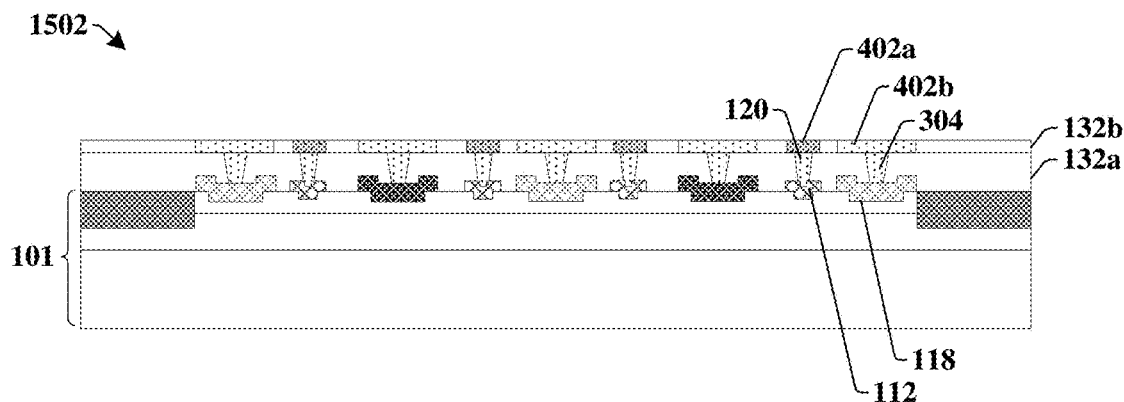
Figure 15C:
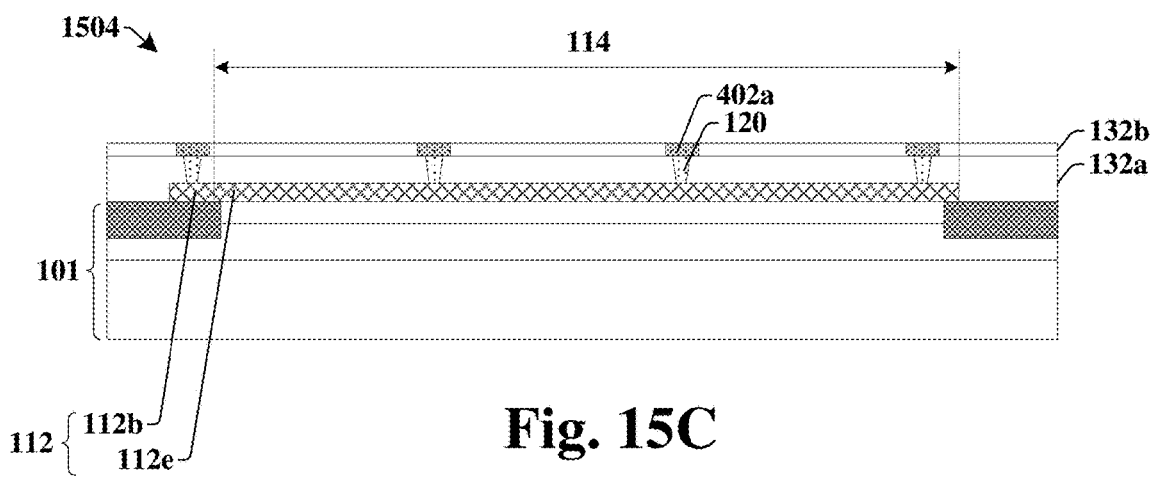

As shown in cross-sectional view 1500 of FIG. 15A, cross-sectional view 1502 of FIG. 15B (taken along line A-A'), and cross-sectional view 1504 of FIG. 15C (taken along line B-B'), a first interconnect layer is formed over the first plurality of conductive contacts 120. The first interconnect layer comprises one or more first gate interconnects 402a formed over the one or more gate extension fingers 112e. The one or more first gate interconnects 402a have lower surfaces that are directly coupled to two or more of the first plurality of conductive contacts 120 on a same gate extension finger. The one or more first gate interconnects 402a provide for an additional path for current to flow to different parts of the one or more gate extension fingers 112e, thereby acting to reduce a resistance of the one or more gate extension fingers 112e. The first interconnect layer further comprises one or more first source/drain interconnects 402b formed over the one or more source contacts 116 and/or the one or more drain contacts 118. The one or more first source/drain interconnects 402b have lower surfaces that are directly coupled to the second plurality of conductive contacts 304.

In some embodiments, the first interconnect layer may be formed by way of a damascene process. In some such embodiments, a second ILD layer 132b is formed over the first ILD layer 132a. The second ILD layer 132b is etched to form openings, which are subsequently filled with a fourth conductive material (e.g., tungsten, copper, and/or aluminum). A second planarization process (e.g., a CMP process) is subsequently performed to remove excess of the fourth conductive material from over the second ILD layer 132b.

Figure 16A:
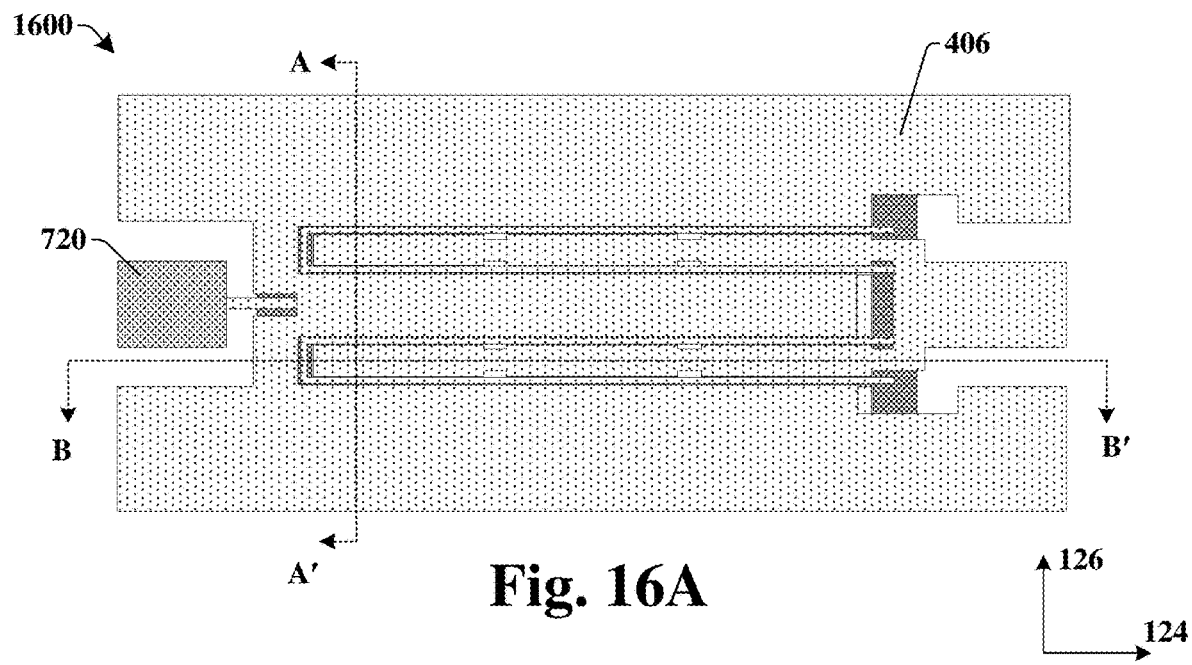
Figure 16B:
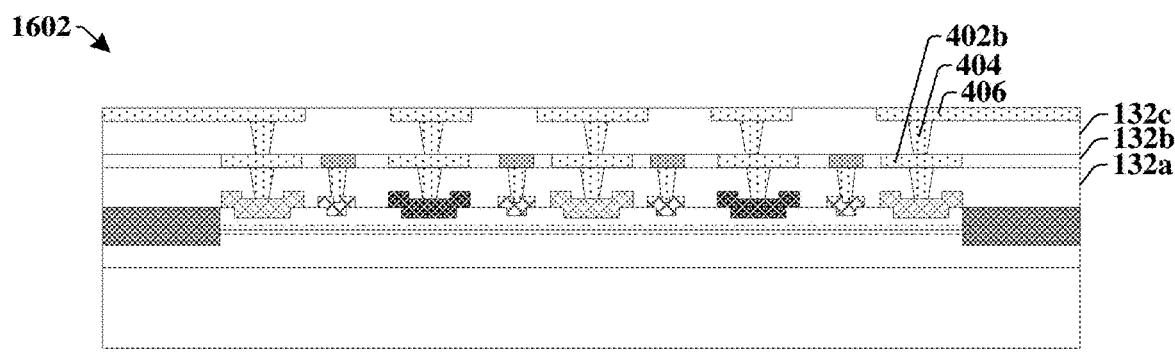
Figure 16C:
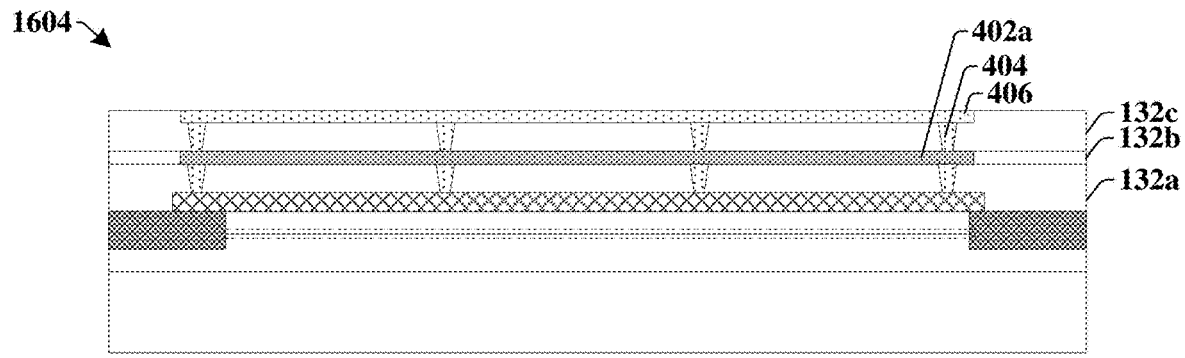

As shown in cross-sectional view 1600 of FIG. 16A, cross-sectional view 1602 of FIG. 16B (taken along line A-A'), and cross-sectional view 1604 of FIG. 16C (taken along line B-B'), a plurality of interconnect vias 404 are formed on the one or more first gate interconnects 402a and the one or more first source/drain interconnects 402b. A second interconnect layer comprising one or more second source/drain interconnects 406 and a second gate interconnect 720 is formed on the plurality of interconnect vias 404. In some embodiments, the plurality of interconnect vias 404 and/or the second interconnect layer may be formed by way of a damascene process. In some such embodiments, a third ILD layer 132c is formed over the second ILD layer 132b. The third ILD layer 132c is etched to form openings, which are subsequently filled with a fifth conductive material (e.g., tungsten, copper, and/or aluminum). A third planarization process (e.g., a CMP process) is subsequently performed to remove excess of the fifth conductive material from over the third ILD layer 132c.

FIGS. 17A-21C illustrate cross-sectional views 1700-2106 of some additional embodiments of a method of forming an integrated chip having a high power transistor device with a low gate resistance.

Figure 17A:
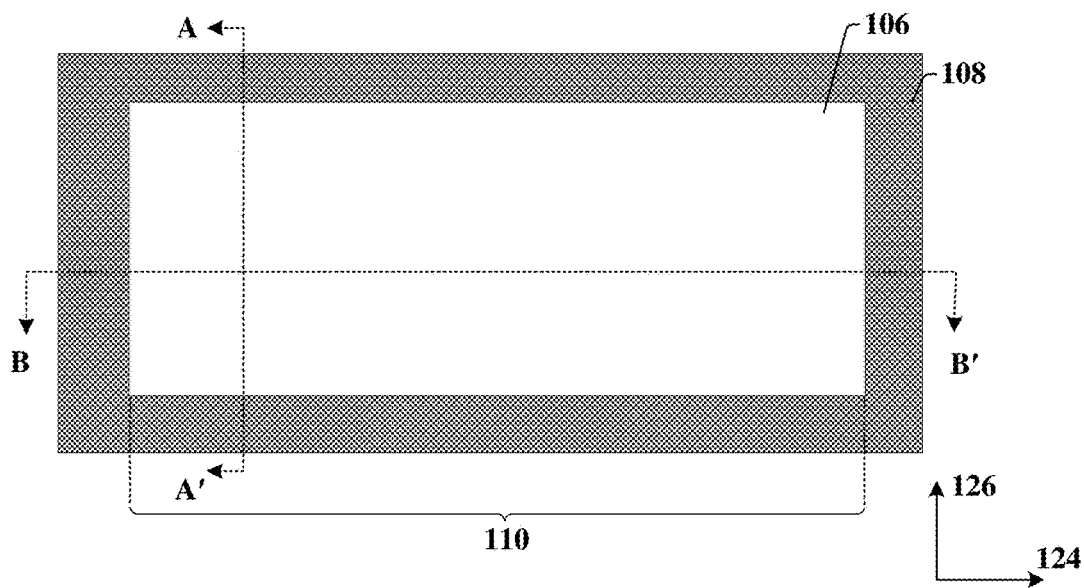
FIGS. 17A-21C illustrate some additional embodiments of a method of forming an integrated chip having a high power transistor device with a low gate resistance.
Figure 17B:
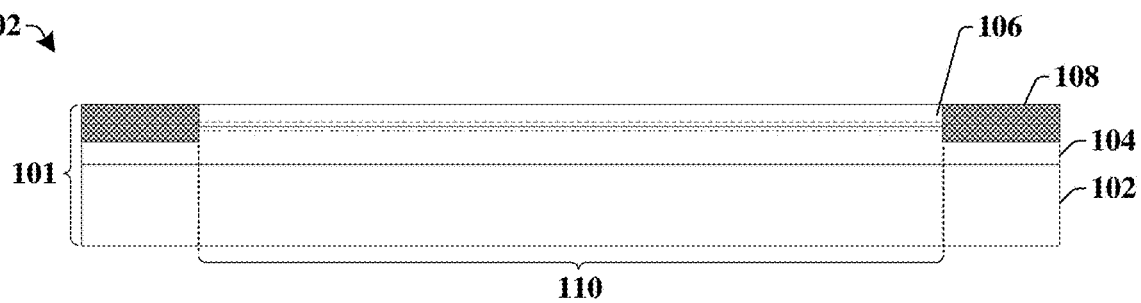
Figure 17C:
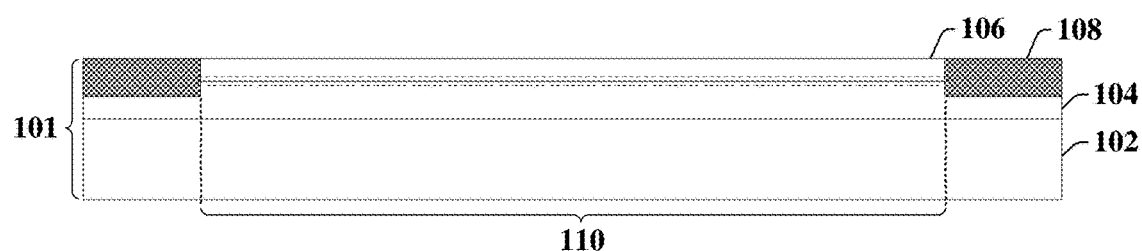

As shown in top-view 1700 of FIG. 17A, cross-sectional view 1702 of FIG. 17B (taken along line A-A'), and cross-sectional view 1704 of FIG. 17C (taken along line B-B'), a substrate 101 is formed by forming one or more epitaxial layers over a base substrate 102. In some embodiments, the one or more epitaxial layers may comprise an active layer 104 (e.g., comprising GaN, GaAs, or the like) formed over the base substrate 102 and a barrier layer 106 (e.g., comprising AlGaN, AlGaAs, or the like) formed over the active layer 104.

After forming the substrate 101, an isolation region 108 is formed within the substrate 101 to extend in a closed and unbroken path that surrounds an active area 110. The active area 110 continuously extends along a first direction 124 and along a second direction 126 that is perpendicular to the first direction 124.

Figure 18A:
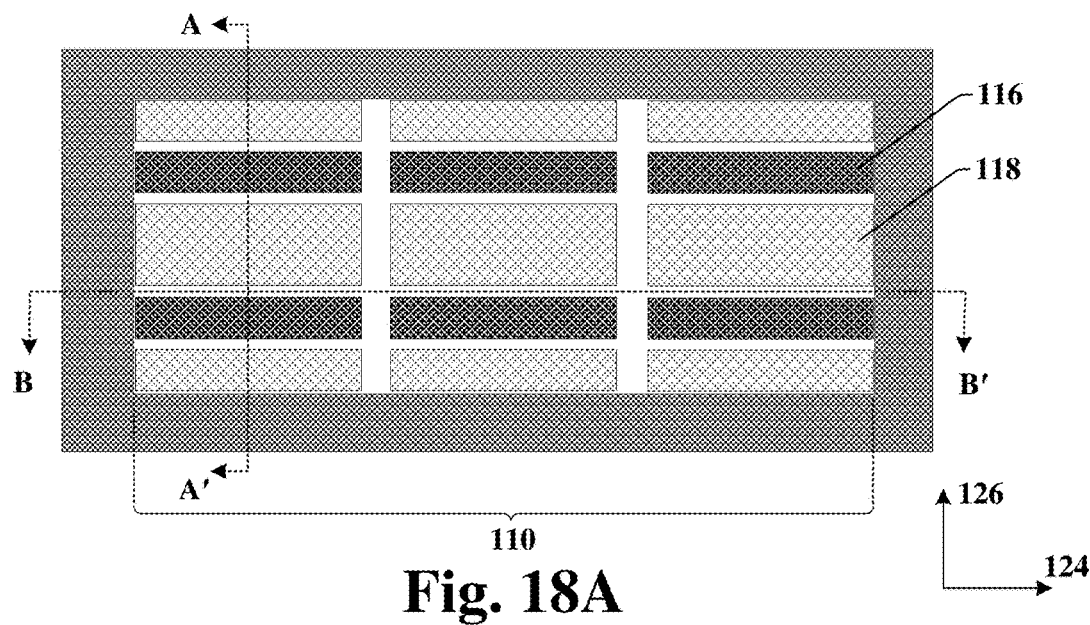
Figure 18B:
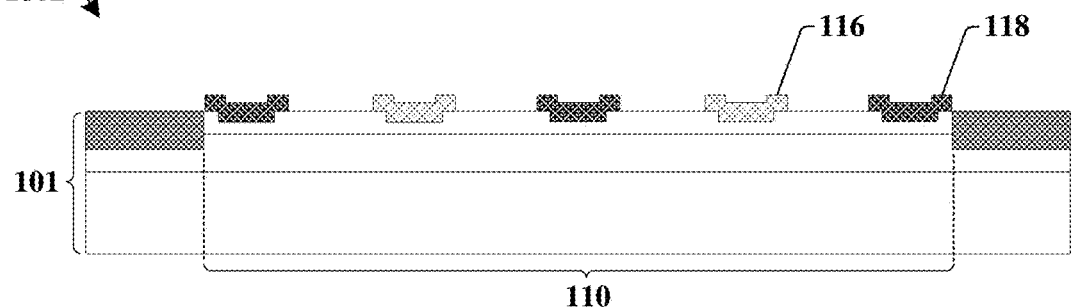
Figure 18C:
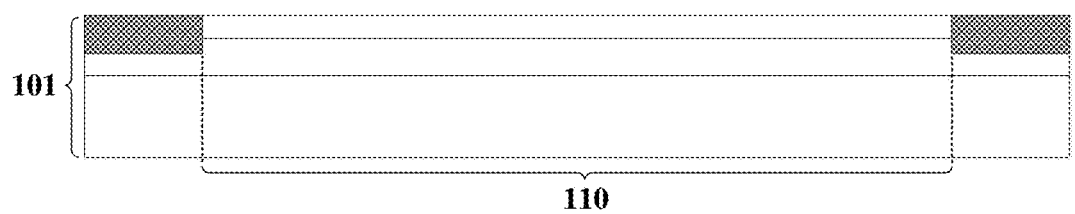

As shown in top-view 1800 of FIG. 18A, cross-sectional view 1802 of FIG. 18B (taken along line A-A'), and cross-sectional view 1804 of FIG. 18C (taken along line B-B'), one or more source contacts 116 and one or more drain contacts 118 are formed over the substrate 101 and within the active area 110. In some embodiments, the one or more source contacts 116 may respectively comprise discrete source contact segments separated along the first direction 124 and the one or more drain contacts 118 may respectively comprise discrete drain contact segments separated along the first direction 124.

Figure 19A:
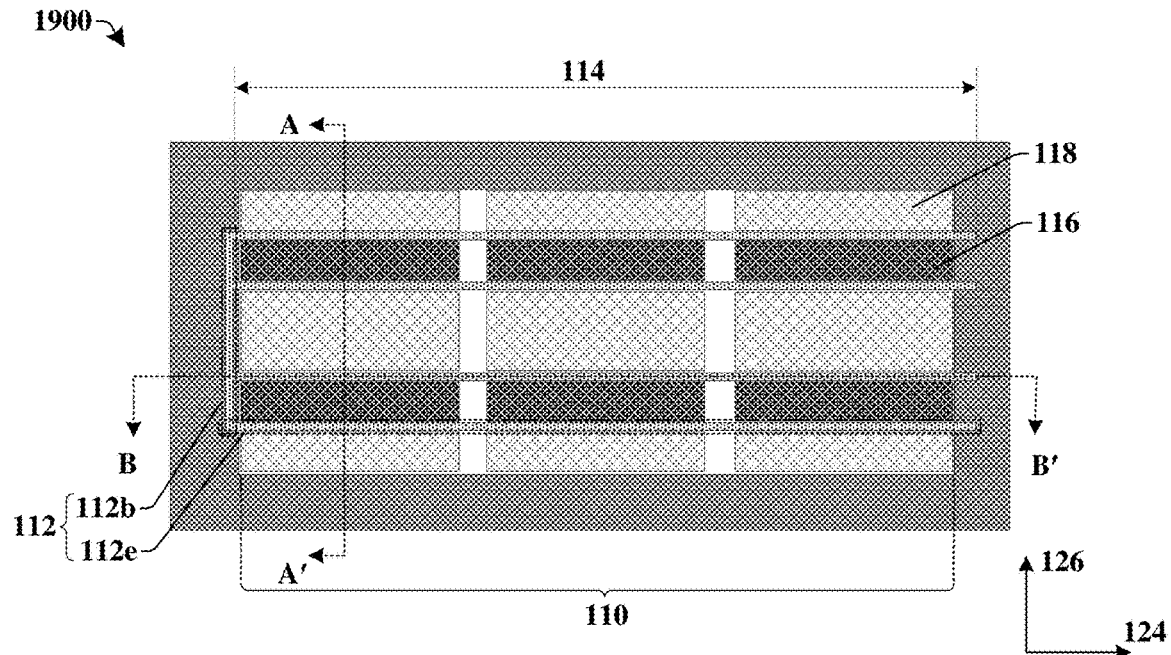
Figure 19B:
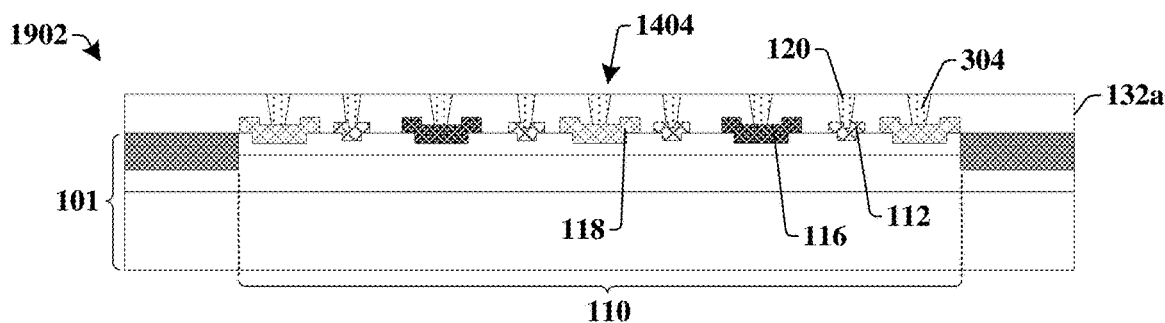
Figure 19C:
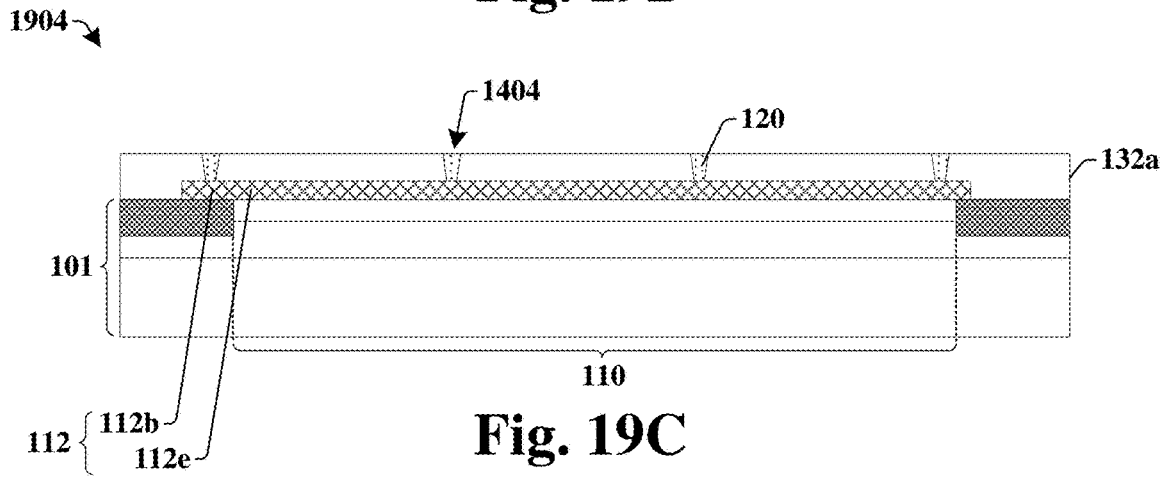

As shown in cross-sectional view 1900 of FIG. 19A, cross-sectional view 1902 of FIG. 19B (taken along line A-A'), and cross-sectional view 1904 of FIG. 19C (taken along line B-B'), a gate structure 112 is formed over the substrate 101 and between adjacent ones of the one or more source contacts 116 and the one or more drain contacts 118. In some embodiments, the gate structure 112 may be formed to have a base region 112b that extends along the second direction 126 and one or more gate extension fingers 112e that extend outward from sidewalls of the base region 112b along the first direction 124. In some embodiments, the one or more gate extension fingers 112e have a length 114 that extends in the first direction 124 past opposing edges of the active area 110.

In some embodiments, after forming the gate structure 112, a first ILD layer 132a may be formed over the substrate 101 to cover the gate structure 112. The first ILD layer 132a is subsequently patterned to form contact openings 1404 that expose the one or more gate extension fingers 112e at multiple locations separated along the first direction 124. Conductive contacts are formed within the contact openings 1404. The conductive contacts comprise a first plurality of conductive contacts 120 formed on the gate structure 112 and a second plurality of conductive contacts 304 formed on the one or more source contacts 116 and/or the one or more drain contacts 118. The first plurality of conductive contacts 120 are separated along the first direction 124 and span a majority of the length 114 of the one or more gate extension fingers 112e (e.g., 50% of the length 114, 75% of the length 114, 90% of the length 114, or other similar values).

Figure 20A:
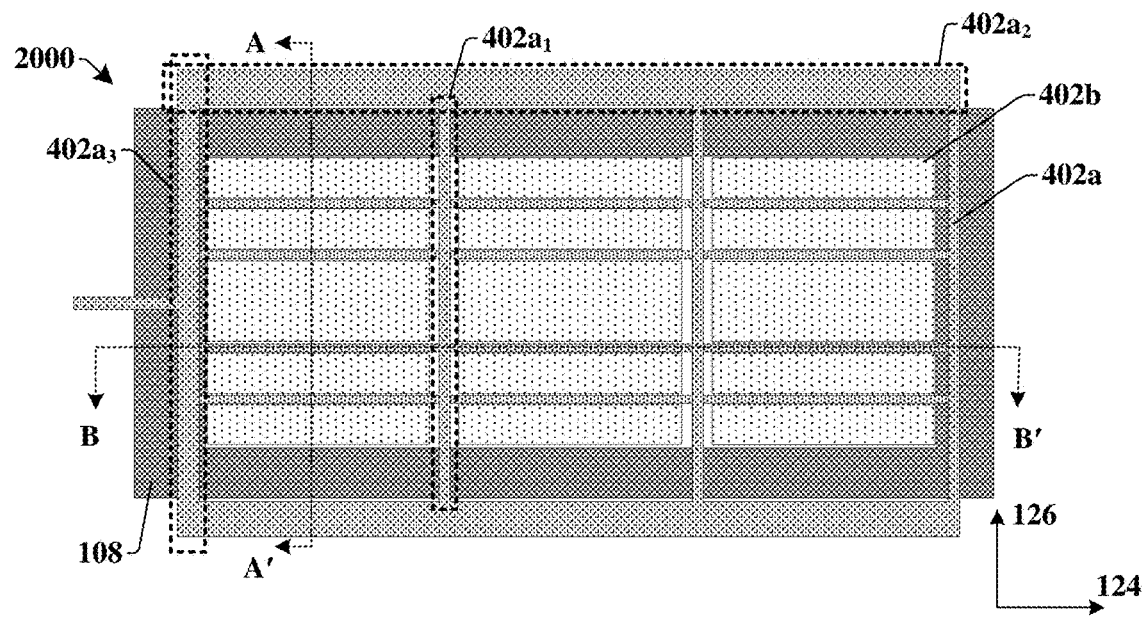
Figure 20B:
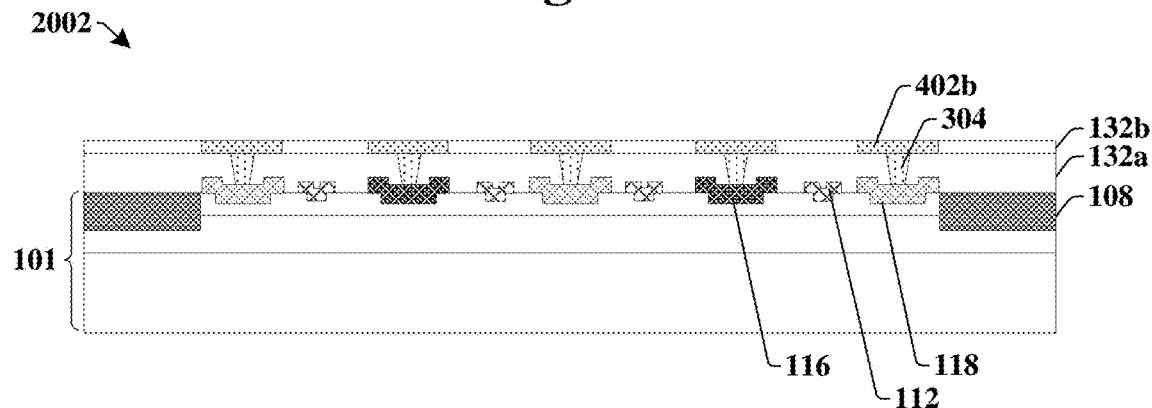
Figure 20C:
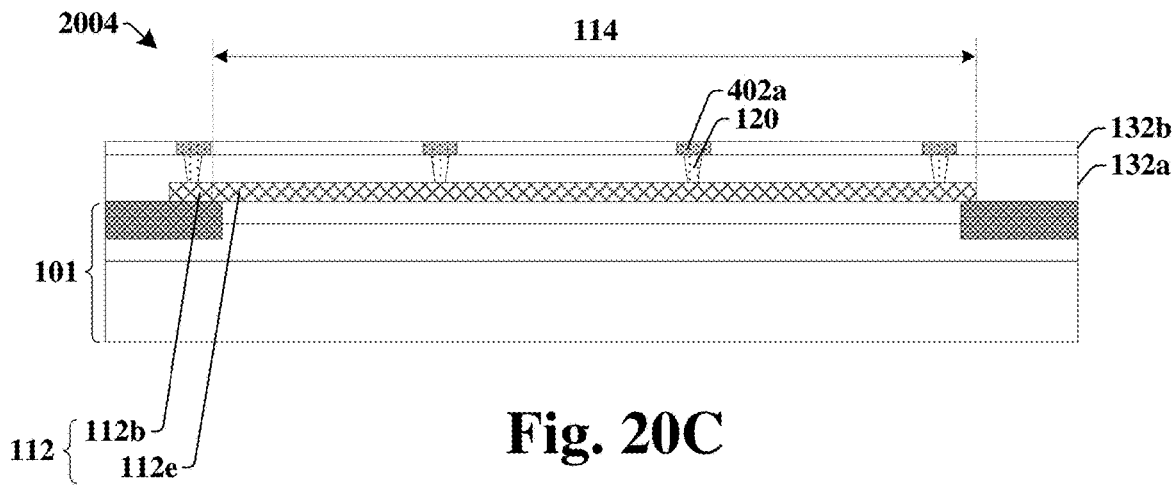

As shown in cross-sectional view 2000 of FIG. 20A, cross-sectional view 2002 of FIG. 20B (taken along line A-A'), and cross-sectional view 2004 of FIG. 20C (taken along line B-B'), a first interconnect layer is formed over the first plurality of conductive contacts 120 and the second plurality of conductive contacts 304. The first interconnect layer comprises one or more first gate interconnects 402a. The one or more first gate interconnects 402a comprise first gate interconnect segments $402a_1$ extending along the second direction 126 and second gate interconnect segments $402a_2$ extending along the first direction 124 and being coupled to the first gate interconnect segments $402a_1$. The first gate interconnect segments $402a_1$ extend between the discrete source contact segments and/or drain contact segments. The first gate interconnect segments $402a_1$ contact one of the first plurality of conductive contacts 120 on different ones of the one or more gate extension fingers 112e. The second gate interconnect segments $402a_2$ run along an outer perimeter of the gate structure 112 and couple the first gate interconnect segments $402a_1$ to a base gate interconnect segment $402a_3$ that overlies and is coupled to the base region 112b of the gate structure 112. By having the first gate interconnect segments $402a_1$ coupled to the base gate interconnect segment $402a_3$, the first gate interconnects 402a are able to provide for an alternative path for current to flow to different parts of the gate extension fingers, thereby allowing a resistance of a relatively long gate extension finger (e.g., a gate extension finger having a length of greater than approximately 500 μm, greater than approximately 750 μm, etc.) to be kept relatively low.

The first interconnect layer further comprises one or more first source/drain interconnects 402b disposed over the one or more source contacts 116 and/or the one or more drain contacts 118. The one or more first source/drain interconnects 402b have lower surfaces that are directly coupled to the second plurality of conductive contacts 304. In some embodiments, the first plurality of conductive contacts 120, the second plurality of conductive contacts 304, and/or the first interconnect layer may be formed by way of a damascene process within a second ILD layer 132b.

Figure 21A:
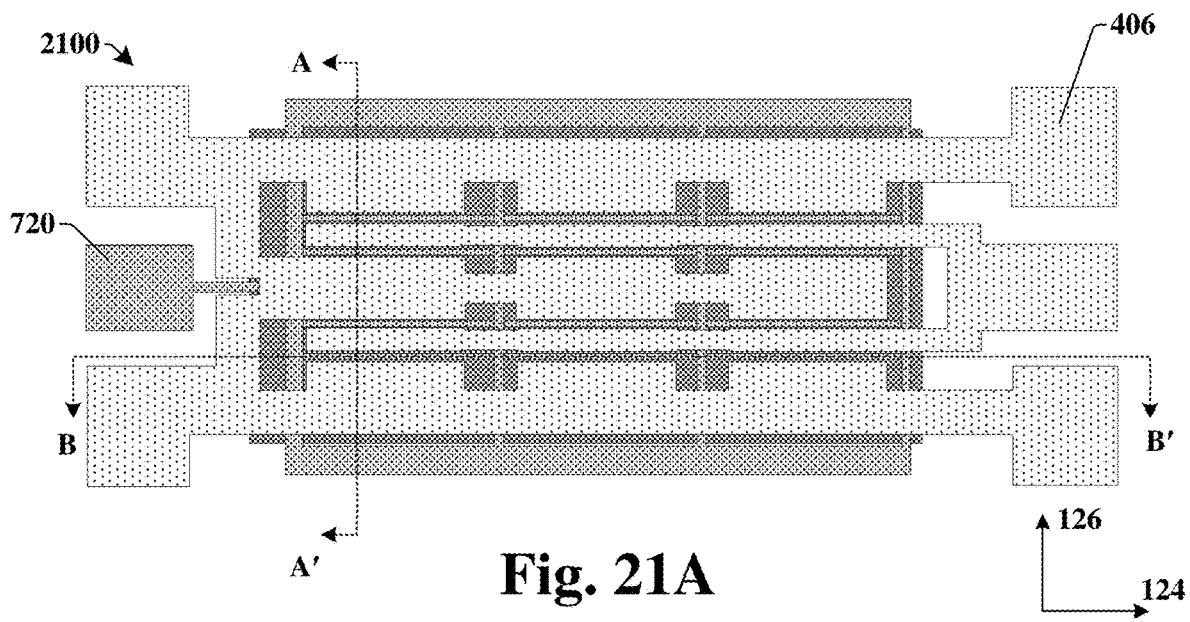
Figure 21B:
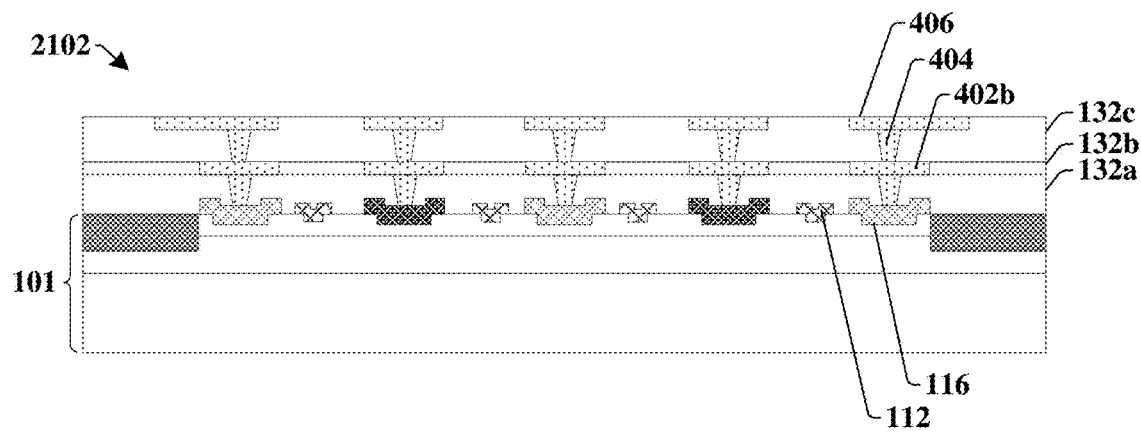
Figure 21C:
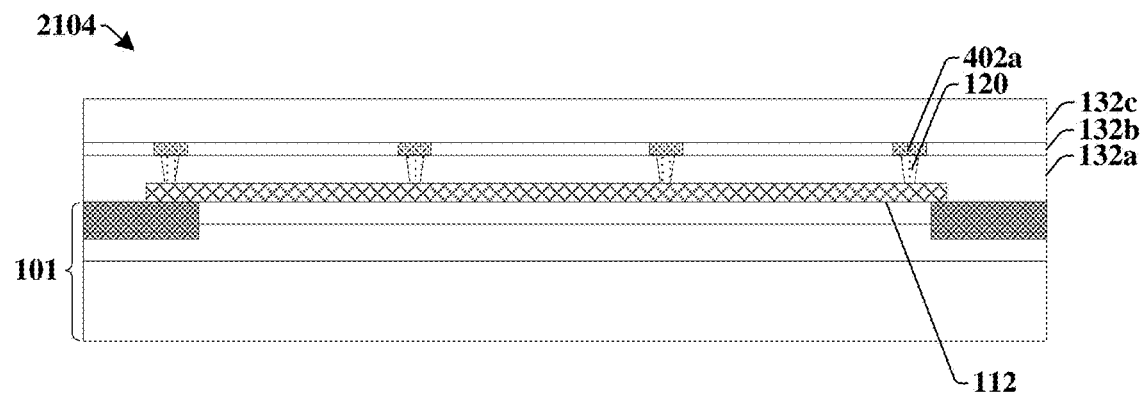

As shown in cross-sectional view 2100 of FIG. 21A, cross-sectional view 2102 of FIG. 21B (taken along line A-A'), and cross-sectional view 2104 of FIG. 21C (taken along line B-B'), a plurality of interconnect vias 404 are formed over the one or more first gate interconnects 402a and the one or more first source/drain interconnects 402b. A second interconnect layer comprising one or more second source/drain interconnects 406 and a second gate interconnect 720 is formed on the plurality of interconnect vias 404. In some embodiments, the plurality of interconnect vias 404 and/or the second interconnect layer may be formed within a third ILD layer 132c by way of a damascene process.

FIG. 22 illustrates a flow diagram of some embodiments of a method 2200 of forming an integrated chip having a high power transistor device with a low gate resistance.

While the disclosed method 2200 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 2202, one or more epitaxial layers may be formed over a base substrate to form a substrate. FIGS. 12A-12C illustrate some embodiments corresponding to act 2202. FIGS. 17A-17C illustrate some alternative embodiments corresponding to act 2202.

At act 2204, an isolation region is formed within the substrate to define an active area that is surrounded by the isolation region. FIGS. 12A-12C illustrate some embodiments corresponding to act 2204. FIGS. 17A-17C illustrate some alternative embodiments corresponding to act 2204.

At act 2206, one or more source contacts and one or more drain contacts are formed over the substrate and within the active area. FIGS. 13A-13C illustrate some embodiments corresponding to act 2206. FIGS. 18A-18C illustrate some alternative embodiments corresponding to act 2206.

At act 2208, a gate structure is formed to have a gate extension finger that protrudes outward from a sidewall of a base region to a length that extends past opposing sides of the active area. FIGS. 14A-14C illustrate some embodiments corresponding to act 2208. FIGS. 19A-19C illustrate some alternative embodiments corresponding to act 2208.

At act 2210, a first plurality of conductive contacts are formed at different locations on the gate structure. The different locations span a majority of the length of the gate extension finger. FIGS. 14A-14C illustrate some embodiments corresponding to act 2210. FIGS. 19A-19C illustrate some alternative embodiments corresponding to act 2210. In some embodiments, first plurality of conductive contacts may be formed according to acts 2212-2216. In such embodiments, a first ILD layer may be formed over the substrate and gate structure at act 2212, the first ILD layer may be patterned to form contact openings exposing different locations on the gate extension finger at 2214, and a conductive material may be formed in the contact openings at 2216.

At act 2218, a first interconnect layer comprising one or more first gate interconnects coupled to the first plurality of conductive contacts is formed. FIGS. 15A-15C illustrate some embodiments corresponding to act 2218. FIGS. 20A-20C illustrate some alternative embodiments corresponding to act 2218.

At act 2220, a second interconnect layer is formed over the first interconnect layer. FIGS. 16A-16C illustrate some embodiments corresponding to act 2220. FIGS. 21A-21C illustrate some alternative embodiments corresponding to act 2220.

Accordingly, in some embodiments, the present disclosure relates to an integrated chip comprising a transistor device having a gate structure that comprises a base region and a gate extension finger protruding outward from a sidewall of the base region along a first direction to a length that extends past opposing sides of an active area within the substrate. A first plurality of conductive contacts are arranged on the gate extension finger and are separated along the first direction so as to span a majority of the length of the gate extension finger. By separating plurality of conductive contacts over the length of the gate extension finger, a resistance of the gate extension finger can be reduced, thereby improving a performance of the transistor device.

In some embodiments, the present disclosure relates to an integrated chip. The integrated chip includes an isolation region disposed within a substrate and surrounding an active area; a gate structure having a base region and a gate extension finger protruding outward from a sidewall of the base region along a first direction to past opposing sides of the active area; a source contact disposed within the active area; a drain contact disposed within the active area and separated from the source contact by the gate extension finger; and a first plurality of conductive contacts arranged on the gate structure and separated along the first direction, the first plurality of conductive contacts being separated by distances overlying the gate extension finger. In some embodiments, the substrate includes a base substrate; a first III-V semiconductor material on the base substrate; and a second III-V semiconductor material on the first III-V semiconductor material. In some embodiments, the base region is disposed directly over the isolation region. In some embodiments, the integrated chip further includes a gate interconnect disposed over the gate extension finger and having a lower surface that faces the substrate, the lower surface contacting the first plurality of conductive contacts that are on the gate extension finger and the base region. In some embodiments, the source contact includes a plurality of discrete source contact segments having sidewalls separated by one or more non-zero distances along the first direction. In some embodiments, the integrated chip further includes a second gate extension finger protruding outward from the sidewall of the base region and separated from the gate extension finger along a second direction that is perpendicular to the first direction, the first plurality of conductive contacts spanning a majority of a length of the second gate extension finger; and a second source contact disposed within the active area, the second gate extension finger extending over the active area between the drain contact and the second source contact. In some embodiments, the integrated chip further includes a gate interconnect extending in the second direction between a first contact of the first plurality of conductive contacts disposed on the gate extension finger and a second contact of the first plurality of conductive contacts disposed on the second gate extension finger, the gate interconnect being coupled to the base region of the gate structure by a third contact of the first plurality of conductive contacts that is on the base region. In some embodiments, the integrated chip further includes a gate interconnect having a first gate interconnect segment that continuously extends in the second direction between a first contact of the first plurality of conductive contacts disposed on the gate extension finger and a second contact of the first plurality of conductive contacts disposed on the second gate extension finger; a second gate interconnect segment that is coupled to the first gate interconnect segment and that extends in the first direction; and a base gate interconnect segment that is coupled to the second gate interconnect segment and that is coupled to a third contact of the first plurality of conductive contacts disposed on the base region. In some embodiments, the first gate interconnect segment is disposed between sidewalls of the plurality of discrete source contact segments. In some embodiments, the integrated chip further includes a first source/drain interconnect segment disposed over a first source contact segment of the plurality of discrete source contact segments; a second source/drain interconnect segment disposed over a second source contact segment of the plurality of discrete source contact segments; and a gate interconnect disposed over the gate extension finger and having a lower surface that faces the substrate and that contacts the first plurality of conductive contacts that are on the gate extension finger and the base region, the gate interconnect being directly between the first source/drain interconnect segment and the second source/drain interconnect segment. In some embodiments, the gate extension finger has a length that is greater than 500 microns.

In other embodiments, the present disclosure relates to an integrated chip. The integrated chip includes an isolation region disposed within a substrate and defining an active area within the substrate; a gate structure having a base region and a plurality of gate extension fingers, the plurality of gate extension fingers respectively protruding outward from a sidewall of the base region along a first direction to have a length that extends past opposing edges of the active area; a first source contact and a second source contact disposed within the active area and separated along a second direction that is perpendicular to the first direction; a drain contact disposed within the active area between the first source contact and the second source contact, the drain contact being separated from the first source contact and the second source contact by the plurality of gate extension fingers; and a plurality of conductive contacts arranged along a majority of the length of the plurality of gate extension fingers. In some embodiments, the length of the plurality of gate extension fingers is greater than or equal to approximately 750 microns. In some embodiments, the plurality of conductive contacts are separated from one another by substantially equal distances. In some embodiments, the first source contact has a plurality of discrete source contact segments, adjacent ones of the plurality of discrete source contact segments having sidewalls facing one another; and the plurality of gate extension fingers extend past the sidewalls of the plurality of discrete source contact segments. In some embodiments, the active area includes a plurality of active area regions separated from one another along the first direction, the plurality of gate extension fingers extending past two or more of the active area regions. In some embodiments, the first source contact includes a plurality of discrete source contact segments aligned along the second direction, the plurality of discrete source contact segments being within one of the plurality of active area regions. In some embodiments, the integrated chip further includes a gate interconnect continuously extending in the second direction between outermost ones of the plurality of gate extension fingers, the gate interconnect directly contacting two or more of the plurality of conductive contacts on the plurality of gate extension fingers. In some embodiments, the integrated chip further includes a gate interconnect continuously extending in the first direction directly over a first gate extension finger of the plurality of gate extension fingers, the gate interconnect being coupled to two or more of the plurality of conductive contacts that are on the first gate extension finger.

In yet other embodiments, the present disclosure relates to a method of forming an integrated chip. The method includes forming an isolation region within a substrate to define an active area; forming a first conductive material onto the active area; patterning the first conductive material to form one or more source contacts and one or more drain contacts within the active area; forming a gate structure to have a base region and a gate extension finger protruding outward from a sidewall of the base region along a first direction to directly between the one or more source contacts and the one or more drain contacts; forming a first dielectric layer over the substrate; patterning the first dielectric layer to form contact openings exposing the gate extension finger at multiple locations separated along the first direction; and forming a second conductive material within the contact openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming an integrated chip, comprising:
   forming an isolation region within a substrate, the isolation region wrapping around an active area of the substrate;
   forming a gate over the substrate, the gate including a base region over the isolation region and a first gate extension finger protruding outward from a sidewall of the base region along a first direction to over the active area of the substrate;
   forming a source having a plurality of discrete source contact segments within the active area;
   forming a drain having a plurality of discrete drain contact segments within the active area, wherein the first gate extension finger separates the source and the drain along a second direction, and wherein the first gate extension finger continuously extends in the first direction past opposing outermost sidewalls of both the plurality of discrete source contact segments and the plurality of discrete drain contact segments; and
   forming a first plurality of conductive contacts on the first gate extension finger, wherein the first plurality of conductive contacts are separated along the first direction by non-zero distances.

2. The method of claim 1, wherein the substrate comprises:
a base substrate;
a first III-V semiconductor material on the base substrate; and
a second III-V semiconductor material on the first III-V semiconductor material.

3. The method of claim 1, further comprising:
forming a gate interconnect over the first gate extension finger, wherein the gate interconnect has a lower surface that faces the substrate and that contacts the first plurality of conductive contacts that are formed on the first gate extension finger and an additional conductive contact that is formed on the base region.

4. The method of claim 1,
wherein the gate further comprises a second gate extension finger protruding outward from the sidewall of the base region, the second gate extension finger being laterally between the drain and a second source; and
wherein a second plurality of conductive contacts are arranged on the second gate extension finger and span a majority of a length of the second gate extension finger.

5. The method of claim 4, further comprising:
forming a gate interconnect extending in the second direction between a first contact of the first plurality of conductive contacts disposed on the first gate extension finger and a second contact of the second plurality of conductive contacts disposed on the second gate extension finger, the second direction being perpendicular to the first direction.

6. The method of claim 5, further comprising:
forming a source interconnect extending in the first direction over the gate interconnect, the source interconnect being coupled to the plurality of discrete source contact segments by a third plurality of conductive contacts.

7. The method of claim 6, wherein the gate interconnect is disposed laterally between two of the plurality of discrete source contact segments.

8. The method of claim 4, wherein the active area comprises a plurality of active area segments that are separated from one another along the first direction, the first gate extension finger continuously extending past edges of the plurality of active area segments.

9. The method of claim 1, wherein the source comprises a bottom surface that continuously extends in the first direction past two or more of the first plurality of conductive contacts.

10. A method of forming an integrated chip, comprising:
forming an isolation region within a substrate and continuously extending around a perimeter of an active area;
forming a gate structure to have a base region and a plurality of gate extension fingers, wherein the plurality of gate extension fingers respectively protrude outward from a sidewall of the base region to past multiple edges of the isolation region;
forming a first source contact and a second source contact within the active area;
forming a drain contact within the active area and between the first source contact and the second source contact, wherein the drain contact is separated from the first source contact and the second source contact by the plurality of gate extension fingers;
forming a plurality of conductive contacts onto the plurality of gate extension fingers, wherein the plurality of conductive contacts extend over a majority of a length of respective ones of the plurality of gate extension fingers; and
forming a gate interconnect to continuously extend over the plurality of gate extension fingers, wherein the gate interconnect directly contacts two or more of the plurality of conductive contacts on neighboring ones of the plurality of gate extension fingers.

11. The method of claim 10, wherein the length of the plurality of gate extension fingers is greater than or equal to approximately 750 microns.

12. The method of claim 10, wherein the plurality of conductive contacts are separated from one another by substantially equal distances.

13. The method of claim 10,
wherein the first source contact comprises a plurality of discrete source contact segments, adjacent ones of the plurality of discrete source contact segments having sidewalls facing one another; and
wherein the plurality of gate extension fingers extend past the sidewalls of the plurality of discrete source contact segments.

14. The method of claim 10, wherein the active area comprises a plurality of active area regions separated from one another, the plurality of gate extension fingers extending past two or more of the active area regions.

15. The method of claim 14, wherein the first source contact comprises a plurality of discrete source contact segments respectively formed within one of the plurality of active area regions.

16. The method of claim 10, further comprising:
forming a source interconnect that is directly over and electrically coupled to the first source contact, wherein the source interconnect is directly over the gate interconnect.

17. A method of forming an integrated chip, comprising:
forming an isolation region within a substrate and continuously extending around a perimeter of an active area;
forming a gate structure to have a base region and a plurality of gate extension fingers, wherein the plurality of gate extension fingers respectively protrude outward from a sidewall of the base region to past multiple edges of the isolation region;
forming a first source contact and a second source contact within the active area;
forming a drain contact within the active area and between the first source contact and the second source contact, wherein the drain contact is separated from the first source contact and the second source contact by the plurality of gate extension fingers;
forming a plurality of conductive contacts onto the plurality of gate extension fingers, wherein the plurality of conductive contacts extend over a majority of a length of respective ones of the plurality of gate extension fingers; and
forming a gate interconnect to continuously extend over and in parallel to a first gate extension finger of the plurality of gate extension fingers, wherein the gate interconnect is coupled to two or more of the plurality of conductive contacts that are on the first gate extension finger.

18. The method of claim 17, wherein the drain contact comprises a plurality of discrete drain contact segments separated from one another along a first direction.

19. The method of claim 18, further comprising:
forming a drain interconnect extending over the plurality of discrete drain contact segments, wherein the drain interconnect is coupled to the plurality of discrete drain contact segments by a plurality of additional conductive contacts.

20. The method of claim 18, wherein the plurality of discrete drain contact segments have substantially equal lengths.

* * * * *